(12) United States Patent
Aksin et al.

(10) Patent No.: US 11,188,112 B2
(45) Date of Patent: Nov. 30, 2021

(54) CURRENT MIRROR ARRANGEMENTS WITH ADJUSTABLE OFFSET BUFFERS

(71) Applicant: Analog Devices, Inc., Norwood, MA (US)

(72) Inventors: Devrim Aksin, Stokesdale, NC (US); Omid Foroudi, Greensboro, NC (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 16/832,144

(22) Filed: Mar. 27, 2020

(65) Prior Publication Data
US 2021/0303018 A1  Sep. 30, 2021

(51) Int. Cl.
*G05F 3/26* (2006.01)
*H03F 3/30* (2006.01)
*H03F 3/45* (2006.01)

(52) U.S. Cl.
CPC .......... *G05F 3/265* (2013.01); *H03F 3/3069* (2013.01); *H03F 3/456* (2013.01); *H03F 2203/30006* (2013.01)

(58) Field of Classification Search
CPC . G05F 3/265; G05F 3/267; G05F 3/26; H03F 3/3069; H03F 3/456; H03F 2203/30006; H03F 3/45596
See application file for complete search history.

(56) References Cited

U.S. PATENT DOCUMENTS 4,791,383 A * 12/1988 Monticelli ............ H03F 3/3076
330/156
5,003,269 A    3/1991  Lehmann
5,079,518 A    1/1992  Wakayama
(Continued)

FOREIGN PATENT DOCUMENTS

EP      209987      1/1987
EP     2187518      5/2010
(Continued)

OTHER PUBLICATIONS

*Chapter 11: The Current Mirror*, (Analog Dev Wiki), http://wiki.analog.com/university/courses/electronics/text/chaper-11, Mar. 27, 2020, 22 pages.
(Continued)

*Primary Examiner* — Jung Kim
(74) *Attorney, Agent, or Firm* — Patent Capital Group

(57) ABSTRACT

An example current mirror arrangement includes a current mirror circuit, configured to receive an input current signal at an input transistor Q1 and output a mirrored signal at an output transistor Q2. The arrangement further includes a buffer amplifier circuit, having an input coupled to Q1 and an output coupled to Q2. The offset of the buffer amplifier circuit can be adjusted by including circuitry for an input or an output side offset adjustment or by implementing the buffer amplifier circuit as a diamond stage with individually controlled current sources for each of the transistors of the diamond stage. Providing an adjustable offset buffer in a current mirror arrangement may advantageously allow benefiting from the use of a buffer outside of a feedback loop of a current mirror, while being able to reduce the buffer offset due to mismatch between master and slave sides of the current mirror circuit.

20 Claims, 10 Drawing Sheets

(56) References Cited

U.S. PATENT DOCUMENTS

| | | | |
|---|---|---|---|
| 5,199,038 A | 3/1993 | Vahala et al. | |
| 5,373,253 A | 12/1994 | Bailey et al. | |
| 5,550,501 A * | 8/1996 | Ito | H03F 3/3076 327/374 |
| 5,656,954 A | 8/1997 | Kondoh et al. | |
| 6,278,326 B1 | 8/2001 | Murray et al. | |
| 6,489,827 B1 | 12/2002 | Sutardja | |
| 6,552,613 B2 | 4/2003 | Murray et al. | |
| 7,295,038 B2 | 11/2007 | Seo | |
| 7,352,235 B2 | 4/2008 | Veenstra et al. | |
| 7,514,978 B2 | 4/2009 | Smelloy et al. | |
| 7,521,971 B2 | 4/2009 | Yamazaki | |
| 7,528,661 B2 | 5/2009 | Damitio | |
| 10,404,222 B2 * | 9/2019 | Danyuk | H03F 3/3076 |
| 2002/0048109 A1 | 4/2002 | Chaiken et al. | |
| 2003/0184386 A1 | 10/2003 | Varner et al. | |
| 2006/0181257 A1 | 8/2006 | Veenstra et al. | |
| 2009/0085654 A1 | 4/2009 | Lin | |
| 2010/0120383 A1 | 5/2010 | Kikuchi et al. | |
| 2019/0341890 A1 | 11/2019 | Yoshida | |

FOREIGN PATENT DOCUMENTS

| | | |
|---|---|---|
| EP | 3447913 | 2/2019 |
| EP | 3792728 | 3/2021 |
| JP | H07235843 | 9/1995 |
| WO | WO 9532548 | 11/1995 |

OTHER PUBLICATIONS

*Single-Ended Buffer* (*SE-buffer*), Calvin's Audio Page, http://calvins-audio-page.jimdofree.com/ideas-and-circuits/buffers/bipolar-buffer-en/, Mar. 27, 2020, 6 pages.

Non-Final Office Action issued in U.S. Appl. No. 16/724,212 dated May 15, 2020.

Chen et al., Current Mirror Circuit with Accurate Mirror Gain for Low βTransistors, ISCAS-HC, May 2001, 4 pages.

Niknejad, Lecture 21: Voltage/Current Buffer Freq Response, EECS 105 Fall 2003, Lecture 21, University of California, Berkley, 20 pages.

Final Office Action issued in U.S. Appl. No. 16/724,212 dated Oct. 1, 2020.

Notice of Allowance dated May 18, 2021 in TW Application No. 109144622, 3 pages.

Bilotti et al., *Noise Characteristics of Current Mirror Sinks/Sources*, IEEE Journal of Solid-State Circuits, vol. SC-10, No. 6, Dec. 1975, 9 pages.

Extended EP Search Report issued in EP21164433.1 dated Aug. 27, 2021, 14 pages.

* cited by examiner

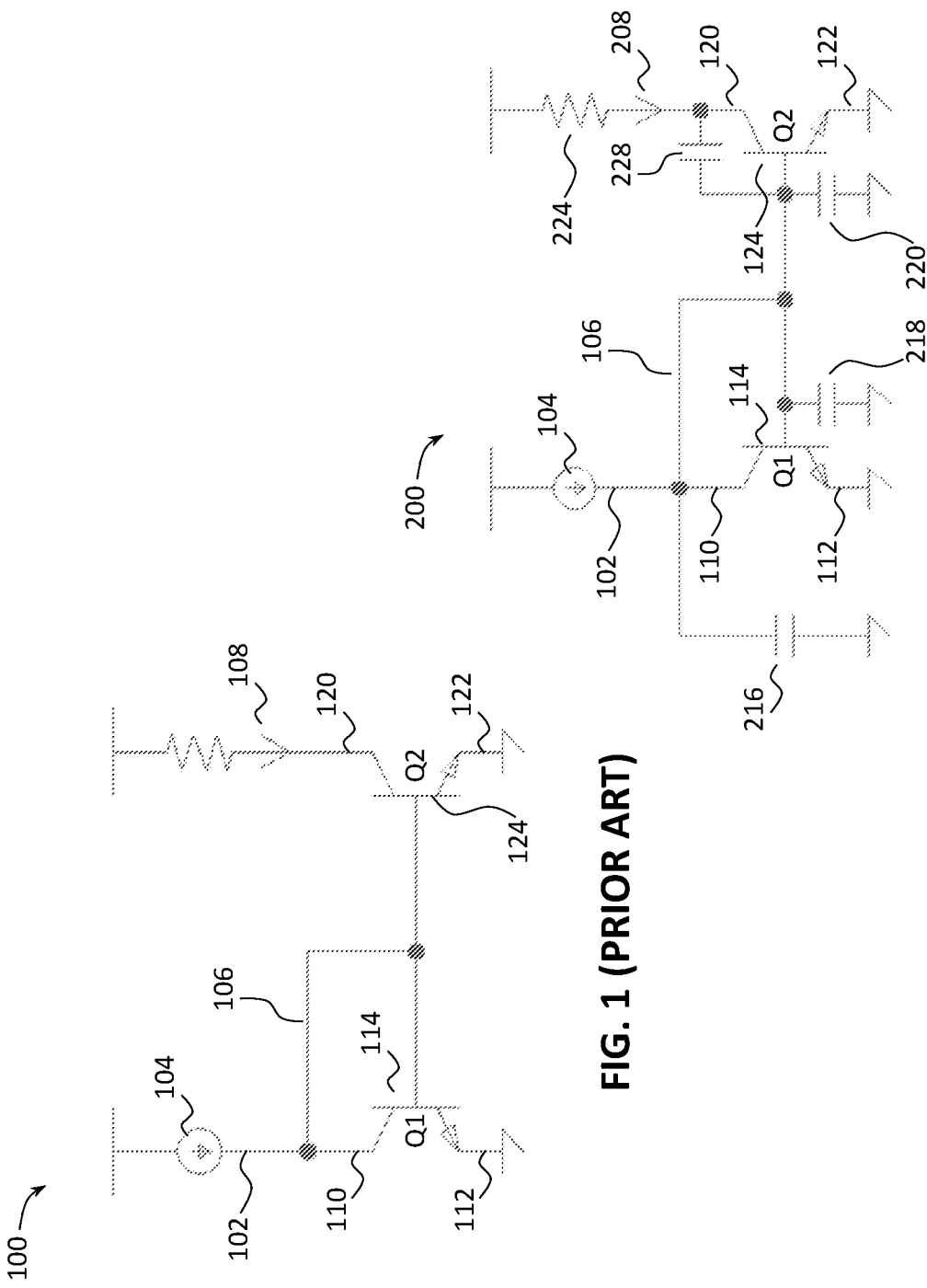

CURRENT MIRROR ARRANGEMENTS WITH ADJUSTABLE OFFSET BUFFERS

TECHNICAL FIELD OF THE DISCLOSURE

The present disclosure relates generally to electronic devices and, more particularly, to current mirror circuits.

BACKGROUND

Current mirrors are one of the few building blocks that are fundamental to the general circuit designs. In particular, broadband, linear current mirrors are one of the major founding blocks of open loop broadband linear amplifiers utilized within wide range of markets, such as communication, military, automotive, and industrial.

Designing current mirrors that can mirror their input current with a constant current gain to their outputs within a wide operating bandwidth in a linear fashion and in presence of the ever increasing fundamental input signal frequency is not trivial. At a given operating frequency, linearity and signal bandwidth of a current mirror ultimately set an upper bound to the dynamic range of an amplifier, or any other circuit in which a current mirror is used. Classically, linearity is traded off with bandwidth and power. Consequently, having current mirrors that have both high linearity and wide signal bandwidth would provide a significant competitive advantage in differentiating products in a given market.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 1 provides an electric circuit diagram of an NPN implementation of a conventional current mirror with a current gain K;

FIG. 2 provides an electric circuit diagram of an NPN implementation of a current mirror of FIG. 1, additionally illustrating relevant parasitic components for high operating frequencies;

DESCRIPTION OF EXAMPLE EMBODIMENTS OF THE DISCLOSURE

Overview

Figures 3, 4:
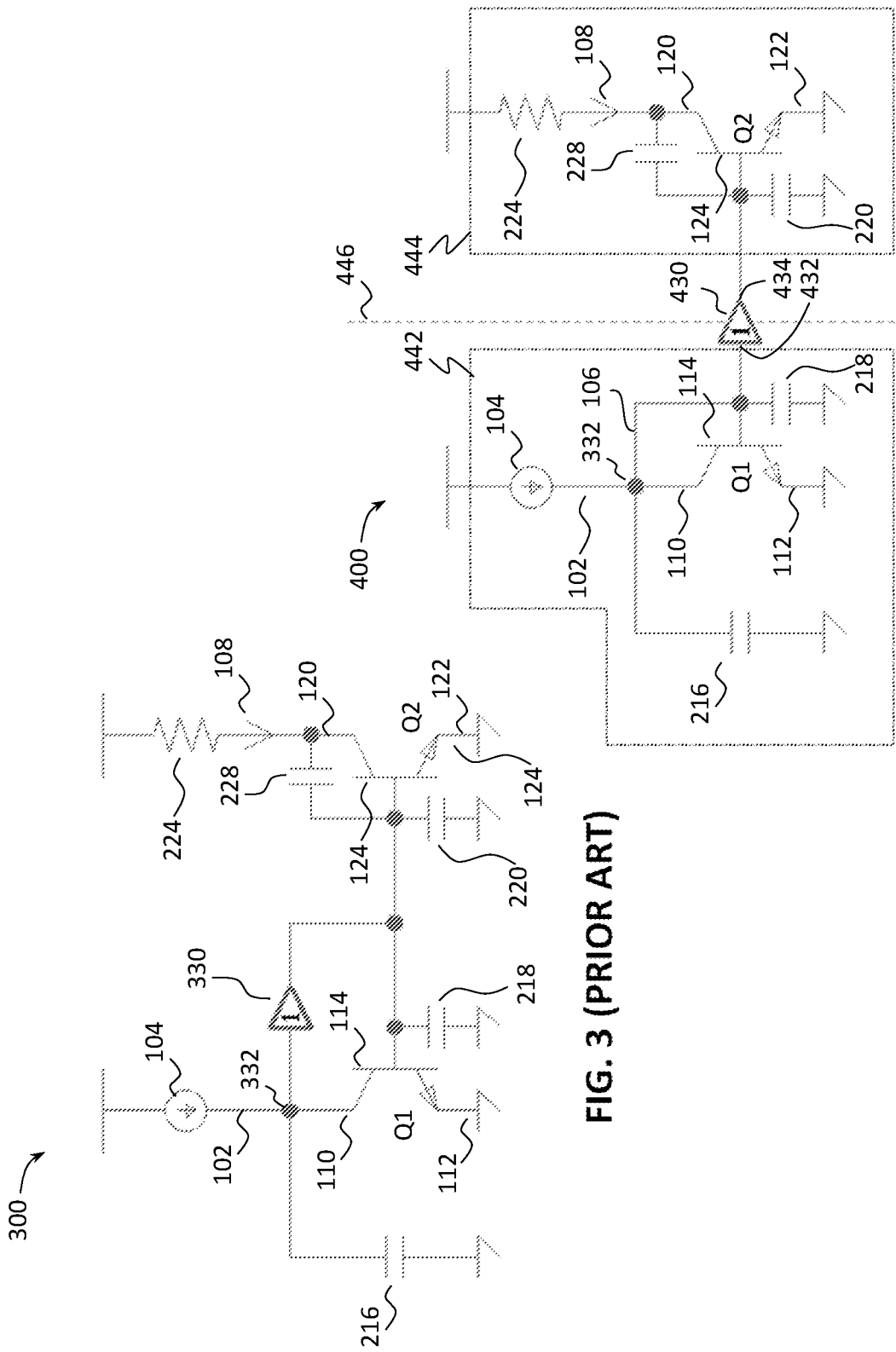
FIG. 3 provides an electric circuit diagram of an NPN implementation of a conventional current mirror with a buffer in a feedback path.
FIG. 4 provides an electric circuit diagram of an NPN implementation of a conventional current mirror with a buffer between base terminals of transistors Q1 and Q2.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

In one aspect, current mirror arrangements with adjustable offset buffers are disclosed. An example arrangement includes a current mirror circuit, configured to receive an input signal (e.g., an input current signal) at an input and output a mirrored signal (e.g., a mirrored current signal) at an output. The current mirror circuit includes an input transistor Q1 and an output transistor Q2. The arrangement further includes a buffer amplifier circuit (or, simply, a "buffer," also known as a unity gain amplifier, a buffer amplifier, a voltage follower, or an isolation amplifier) that has an input coupled to the input transistor Q1 and an output coupled to the output transistor Q2. The offset of the buffer amplifier circuit, generally defined as a difference between the voltages at the input and the output (or vice versa) of the buffer amplifier circuit, can be adjusted by including circuitry for an input or an output side offset adjustment or by implementing the buffer amplifier circuit as a diamond stage with individually controlled current sources for each of the transistors of the diamond stage. Providing an adjustable offset buffer in a current mirror arrangement may advantageously allow benefiting from the use of a buffer outside of a feedback loop of a current mirror (which may help solve stability issues associated with buffers included within the feedback loop of current mirrors and provide bandwidth and linearity improvements), while being able to reduce, minimize, or eliminate the buffer offset due to mismatch between master and slave sides of the current mirror circuit (which could, otherwise, significantly degrade linearity). In general, the "master side" of a current mirror may refer to a branch of a current mirror circuit where the input signal is received, and the "slave side" of a current mirror may refer to a branch of a current mirror circuit where the output signal is provided. Thus, by including adjustable offset buffers in current mirror arrangements, as described herein, advantages of improved stability buffers may be realized while reducing or eliminating the negative effects of the buffer offsets that may be introduced by the buffers.

The exact design of the current mirror arrangements with adjustable offset buffers may be realized in many different ways, all of which being within the scope of the present disclosure. In one example of design variations according to various embodiments of the present disclosure, a choice can be made, individually for each of the transistors of a current mirror arrangement with an adjustable offset buffer), to employ bipolar transistors (e.g., where various transistors may be NPN or PNP transistors), field-effect transistors (FETs), e.g., metal-oxide-semiconductor (MOS) technology transistors (e.g., where various transistors may be N-type MOS (NMOS) or P-type MOS (PMOS) transistors), or a combination of one or more FETs and one or more bipolar transistors. In view of that, in the following descriptions, transistors are described with reference to their first, second, and third terminals. The term "first terminal" of a transistor is used to refer to a base terminal if the transistor is a bipolar transistor or to a gate terminal if the transistor is a FET, the term "second terminal" of a transistor is used to refer to a collector terminal if the transistor is a bipolar transistor or to a drain terminal if the transistor is a FET, and the term "third terminal" of a transistor is used to refer to an emitter terminal if the transistor is a bipolar transistor or to a source terminal if the transistor is a FET. These terms remain the same irrespective of whether a transistor of a given technology is an N-type transistor (e.g., an NPN transistor if the transistor is a bipolar transistor or an NMOS transistor if the transistor is a FET) or a P-type transistor (e.g., a PNP transistor if the transistor is a bipolar transistor or a PMOS transistor if the transistor is a FET).

In another example, in various embodiments, a choice can be made, individually for each of the transistors of a current mirror arrangement with adjustable offset buffers, as to which transistors are implemented as N-type transistors (e.g., NMOS transistors for the transistors implemented as FETs, or NPN transistors for the transistors implemented as bipolar transistors) and which transistors are implemented as P-type transistors (e.g., PMOS transistors for the transistors implemented as FETs, or PNP transistors for the transistors implemented as bipolar transistors). In yet other examples, in various embodiments, a choice can be made as to what type of transistor architecture to employ. For example, any of the transistors of the current mirror arrangements with adjustable offset buffers as described herein that are implemented as FETs may be planar transistors or non-planar transistors such as FinFETs, nanowire transistors or nanoribbon transistors. Some example implementations of current mirror arrangements with adjustable offset buffers are shown in FIGS. 5-11. However, any implementation of the current mirror arrangement with adjustable offset buffers in line with the descriptions provided herein is within the scope of the present disclosure.

In some embodiments, the current mirror arrangements with adjustable offset buffers may be implemented as single-ended current mirror arrangements. In other embodiments, the current mirror arrangements may be implemented as differential current mirror arrangements, meaning that an example current mirror arrangement may include what is referred to herein as a "first portion" and a "second portion" and each of the portions may include a current mirror circuit and an adjustable offset buffer as described herein. The current mirror circuit of each portion may be configured to receive a respective (i.e., different) input signal (e.g., current) at an input and provide a respective output signal (e.g., current) at an output. The current mirror circuit of each portion may include the input transistor Q1 and the output transistor Q2, each of which includes a first, a second, and a third terminals. In each portion, the second terminal of Q1 is coupled to the input of the current mirror circuit for the portion (i.e., coupled to the input signal for the portion) and also coupled to its own first terminal (i.e., to the first terminal of Q1), and the second terminal of Q2 is coupled to the output of the current mirror circuit for the portion (i.e., coupled to the output signal for the portion). Each portion may further includes an adjustable offset buffer, that has an input coupled to the input transistor Q1 and an output coupled to the output transistor Q2 of the portion. In some embodiments, the first portion may receive the input signal in the form of a first input current $I_{INP}$ that is based on a sum of a bias current $IB_{CMA}$ for the current mirror arrangement and a signal current $I_{IN}$ (e.g., $I_{INP}=IB_{CMA}+I_{IN}$), while the second portion may receive the input signal in the form of a second input current $I_{INM}$ that is based on a difference between the bias current $IB_{CMA}$ and the signal current $I_{IN}$ (e.g., $I_{INM}=IB_{CMA}-I_{IN}$) In such embodiments, the output current of the first portion may be $I_{OP}=K*I_{INP}$, while the output current of the second portion may be $I_{OM}=K*I_{INM}$. Thus, for each portion of a differential current mirror arrangement, a ratio of the output signal to the input signal may be substantially equal to K, where K is a current gain which may be any positive number greater than 0, which value may, but does not have to be, an integer. For the bipolar implementation embodiments, the value of K may be indicative of (e.g., be equal to or be based on) a ratio of an area of the emitter of the output transistor Q2 to an area of the emitter of the input transistor Q1. For the FET implementation embodiments, the value of K may be indicative of a ratio of the aspect ratio of the output transistor Q2 to the aspect ratio of the input transistor Q1, where an aspect ratio of a FET transistor may be defined as a channel width of the transistor divided by its' channel length. In the embodiments where K is greater than 0 but less than 1, multiplying by a factor of K means attenuating the input signal to generate the output signal. In the embodiments where K is greater than 1, multiplying by a factor of K means increasing, or gaining, the input signal to generate the output signal.

As will be appreciated by one skilled in the art, aspects of the present disclosure, in particular aspects of current mirror arrangements with adjustable offset buffers, as described herein, may be embodied in various manners—e.g., as a method or as a system. The following detailed description presents various descriptions of specific certain embodiments. However, the innovations described herein can be embodied in a multitude of different ways, for example, as defined and covered by the claims or select examples. For example, while some of the descriptions are provided herein with respect to either bipolar (e.g., NPN or PNP implementations) or field-effect (e.g., NMOS or PMOS implementations) transistors, further embodiments of the current mirror arrangements described herein may include any combinations of bipolar transistors and FETs.

In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With the numerous examples provided herein, interaction may be described in terms of two, three, four, or more electrical components. However, this has been done for purposes of clarity and example only. It should be appreciated that the devices and systems described herein can be consolidated in any suitable manner. Along similar design alternatives, any of the illustrated components, modules, and elements of the present drawings may be combined in various possible configurations, all of which are clearly within the broad scope of the present disclosure. In certain cases, it may be easier to describe one or more of the functionalities of a given set of flows by only referencing a limited number of electrical elements. It should be appreciated that the electrical circuits of the present drawings and its teachings are readily scalable and can accommodate a large number of components, as well as more complicated or sophisticated arrangements and configurations. Accordingly, the examples provided should not limit the scope or inhibit the broad teachings of the electrical circuits as potentially applied to a myriad of other architectures.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. If used, the terms "substantially," "approximately," "about," etc., may be used to generally refer to being within +/−20% of a target value, e.g., within +/−10% of a target value, based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A, B, and/or C).

Basics of Current Mirrors

For purposes of illustrating current mirror arrangements with adjustable offset buffers, proposed herein, it might be useful to first understand phenomena that may come into play when current is mirrored. The following foundational information may be viewed as a basis from which the present disclosure may be properly explained. Such information is offered for purposes of explanation only and, accordingly, should not be construed in any way to limit the broad scope of the present disclosure and its potential applications.

FIG. 1 provides an electric circuit diagram of a simple single-ended NPN bipolar transistor implementation of a current mirror 100 with a current gain of K, as known in the art. As shown in FIG. 1, the current mirror 100 may include a first transistor Q1 (which may be referred to as an "input transistor") and a second transistor Q2 (which may be referred to as an "output transistor"). An input current 102 ($I_{IN}$) (i.e., the current to be mirrored at the output of the current mirror 100 to generate an output current 108) may be provided by an input current source 104. The current mirror 100 may first generate a control voltage (voltage VN1) at a node 106 (node N1) by placing the transistor Q1 in feedback to force the current at a collector terminal 110 (or, simply, "collector" 110) of the transistor Q1 to be equal to the input current 102. An emitter terminal 112 (or, simply, "emitter" 112) of the transistor Q1 may be connected to ground, as shown in FIG. 1. A base terminal 114 (or, simply, "base" 114) of the transistor Q1 may be coupled to a base 124 of the transistor Q2. The base 124 of the output transistor Q2 may be driven with the voltage VN1 carrying the input current information to generate the output current 108. FIG. 1 also indicates a collector 120 of the transistor Q2 and an emitter 122 of the transistor Q2, where the emitter 122 may be coupled to ground and where the output current 108 is the current at the collector 120, as shown in FIG. 1. When the emitter area of the transistor Q2 is K times larger than that of the transistor Q1, the output current 108 ($I_O$) may be equal to $K \cdot I_{IN}$.

The simplified model of a bipolar transistor collector current is given by $$I_C = A I_S \exp\left(\frac{V_{BE}}{V_t}\right)$$

where $I_C$, A, $I_S$, $V_{BE}$ and $V_t$ are collector current, emitter area, unit area saturation current, the base-emitter voltage and thermal voltage, respectively. Although the relation between collector current ($I_C$) to base-emitter voltage ($V_{BE}$), or, equivalently input current $I_{IN}$ and VN1, is strongly nonlinear, the input-output current mirroring relation is linear, i.e. $I_O = K \cdot I_{IN}$.

The basic analysis given above has many shortcomings in understanding the performance degradation of current mirrors at high operating frequencies. FIG. 2 provides an electric circuit diagram of an NPN implementation of a current mirror 200. The current mirror 200 is substantially the same as the current mirror circuit 100 of FIG. 1, except that it additionally illustrates relevant parasitic components for high operating frequencies. In other words, FIG. 2 illustrates important parasitic devices that may degrade the bandwidth and the linearity of the circuit 100. It is to be understood that parasitic components shown in the present drawings and discussed herein refer to components which are not deliberately fabricated in a circuit, but, rather, electric circuit diagram representations of inadvertent effects or behavior that may be exhibited by a circuit.

Elements of FIG. 2 having reference numerals shown in FIG. 1 are intended to illustrate the same or analogous elements as those described with respect to FIG. 1, so that, in the interest of brevity, their descriptions are not repeated. This is applicable to other figures of the present disclosure—elements with reference numerals described with reference to one figure may be the same or analogous as elements with the same reference numerals shown in another figure, so that descriptions provided for one figure are applicable to the other figure and don't have to be repeated.

The current mirror 200 may be affected by one of more of a parasitic capacitance 216, a parasitic capacitance 218, a parasitic capacitance 220, a parasitic capacitance 228, and a resistance 224 (which may be used to convert the output current of the current mirror to voltage), each of which coupled as shown in FIG. 2.

The parasitic capacitance 216 may represents all routing parasitic capacitances associated with the node 106, parasitic capacitance of 104 input current source loading node 106, as well as collector-substrate capacitance and extrinsic base terminal parasitic capacitors of the transistors Q1 and Q2. Note that the modern SOI process based bipolar transistor collector-substrate capacitor is relatively small and can be treated as being linear. The parasitic capacitance 218 may represent the intrinsic base-emitter forward-bias diffusion capacitance of the transistor Q1. The parasitic capacitance 220 may represent the intrinsic base-emitter forward-bias diffusion capacitance of the transistor Q2 (and may be K times larger than the parasitic capacitance 218 if the emitter area of the transistor Q2 is K times larger than that of the transistor Q1). The parasitic capacitance 228 may represent the intrinsic base-collector junction parasitic capacitance of the transistor Q2. The resistance 224 may represent an output resistance (RO) of the current mirror 100/200.

Inventors of the present disclosure realized that, as can be seen from the analysis of the circuit in FIG. 2, three distinct mechanisms degrading the bandwidth and/or the linearity of the current mirror may be identified for bipolar transistor implementations. One is bandwidth degradation due to the parasitic capacitors. Another one is linearity degradation due to nonlinearity of the intrinsic base-collector junction parasitic capacitance (e.g., the parasitic capacitance 228, shown in FIG. 2). The third one is linearity degradation due to linear parasitic capacitance 216.

Similarly, a number of linearity degradation mechanisms may be identified for FET implementations of current mirror circuits. One degradation mechanism for the FET implementations is bandwidth degradation due to the parasitic capacitors, similar to the bipolar implementations. Another one is linearity degradation due to linear capacitive load on node 106. The third one is linearity degradation due to gate-drain capacitance $C_{GD}$.

Inventors of the present disclosure further realized that improving on at least some of these degradation mechanisms could provide an improvement in terms of designing linear broadband current mirrors.

Current Mirror Arrangements with Buffers

A typical solution to overcome the limitation(s) associated with high operating frequencies (thus overcoming the bandwidth limitations) of a simple current-mirror is to add a buffer between the collector of the transistor Q1 and the bases of the transistors Q1 and Q2, as shown in FIG. 3.

FIG. 3 provides an electric circuit diagram of an NPN implementation of a current mirror 300 with a buffer 330 in a feedback path (i.e., a path between the collector 110 of the transistor Q1 and the base 114 of the transistor Q1). The current mirror 300 is substantially the same as the current mirror circuit 200 of FIG. 2, except that it additionally illustrates the buffer 330. Such a modification of the current mirror 200 may drastically reduce capacitance across the diode-connected transistor Q1 and, therefore, significantly improve the bandwidth of the circuit. Buffering may also improve the linearity of the circuit by reducing the impacts of the parasitic capacitances portion of 216 associated with the transistor Q2 and the parasitic capacitance 228. For example, buffering may lower the impact of the nonlinear currents associated with the parasitic capacitance 228 by (K+1) times. However, the non-idealities of the buffer 330 itself may make the stability of the circuit 300 challenging (note that node 332 may be a high impedance node for this configuration) such that by the time the circuit 300 is made stable, the high-frequency performance is not that much better than of the circuit 200.

In some implementations, the buffer 330 can be moved outside the feedback loop such that the stability is no longer an issue. This is shown in FIG. 4, providing an electric circuit diagram of an NPN implementation of a current mirror 400 with a buffer 430 between the base terminals of the transistors Q1 and Q2. The buffer 430 may be a unity gain amplifier, a buffer amplifier, a voltage follower, or an isolation amplifier.

In FIG. 4 and subsequent drawings, the "master side" may refer to components of a given current mirror shown to the left of the buffer between the base or gate terminals of the transistors Q1 and Q2 (the master side labeled in FIG. 4 as a portion 442 within a dotted contour), i.e., to the left of a vertical dashed line 446 shown in FIG. 4, while the "slave side" may refer to components of a given current mirror shown to the right of that buffer (the slave side labeled in FIG. 4 as a portion 444 within a dotted contour), i.e., to the right of the line 446. The current mirror 400 is substantially the same as the current mirror circuit 200 of FIG. 2, except that it additionally illustrates the buffer 430 provided between the master side 442 and the slave side 444. As shown in FIG. 4, in such a configuration, the collector 100 and the base 114 of the transistor Q1 are shorted and connected to an input 432 of the buffer 430, while an output 434 of the buffer 430 is connected to the base 124 of Q2. Compared to the buffer 330 shown in the arrangement of FIG. 3, although moving the buffer out of the feedback loop to implement it as the buffer 430 may solve the stability issue and provide bandwidth and linearity improvements, the buffer 430 may be associated with an offset that may become an issue in this scenario since it may cause the standing current in the transistor Q2 to be off, degrading linearity due to mismatch between the master side and the slave side. As is known in the art, a buffer is, basically, a component that is supposed to regenerate an output voltage substantially identical to its input voltage (i.e., gain should be equal to 1). As also known in the art, an offset error (or, simply, "offset" or a "buffer offset") is one type of non-idealities of buffers, where the offset error modifies the transfer function of a buffer from being desired y=x (where y is an output of the buffer and x is the input of the buffer) to y=x+off, where "off" is the buffer offset. Thus, in general, "buffer offset" refers to a DC quantity (i.e., not frequency-dependent) meaning that, assuming that a buffer has an infinite bandwidth, then when the input voltage is subtracted from the output voltage of the buffer then the difference will be equal to the offset voltage for any input frequency.

Current Mirror Arrangements with Adjustable Offset Buffers

In general, different techniques may be implemented to improve on one or more of the problems described above, where some tradeoffs may have to be made, e.g., in trading performance with complexity. Embodiments of the present disclosure aim to address/limit the nonlinearity and the bandwidth degradation related to one or more of the base-emitter junction parasitic capacitance 220 of the transistor Q2, part of the parasitic capacitance 216 associated with the transistor Q2, and the miller-amplified base-collector junction parasitic capacitance 228 of the transistor Q2, described above. The nonlinear base-collector junction parasitic capacitance can be quite large due to the large quiescent current at the output of the current mirror, common for broadband designs. The base-collector junction parasitic capacitance may convert the output signal swing to a nonlinear current at the output node and load the diode side of the current mirror, hence degrading the overall linearity, as well as also reducing the current mirror bandwidth due to miller effect. Embodiments of the present disclosure are based on recognition that implementing buffering in current mirror arrangements may provide an improvement with respect to reducing nonlinearity related to the base-collector junction parasitic capacitance 228 of the transistor Q2 and the base-emitter junction parasitic capacitance 220.

More specifically, embodiments of the present disclosure are based on recognition that the issue of the standing current and buffer offset, described above, may be addressed by reducing the buffer offset as much as possible for a given design (e.g., by eliminating the buffer offset altogether). In particular, embodiments of the present disclosure are based on providing means for adjusting (e.g., reducing) the buffer offset so that the impact of the buffer offset of the buffer 430 on the standing current of the transistor Q2 may be contained within acceptable limits (e.g., so that the current mirror arrangement's nonlinearity which, if no precautions are taken, may inadvertently be present due to inclusion of one or more buffers, may be reduced or eliminated). In the following sections, three different approaches to providing adjustable offset buffers in current mirror arrangements will be described. The first approach is described with reference to FIGS. 5-7 and may be referred to as an adjustable offset buffer with a diamond stage. The second approach is described with reference to FIGS. 8-9 and may be referred to as an adjustable offset buffer with an input side adjustment. The third approach is described with reference to FIGS. 10-11 and may be referred to as an adjustable offset buffer with an output side adjustment. In various embodiments, a current mirror arrangement may implement any one or any combination of these approaches.

Adjustable Offset Buffer with a Diamond Stage

Figure 5:
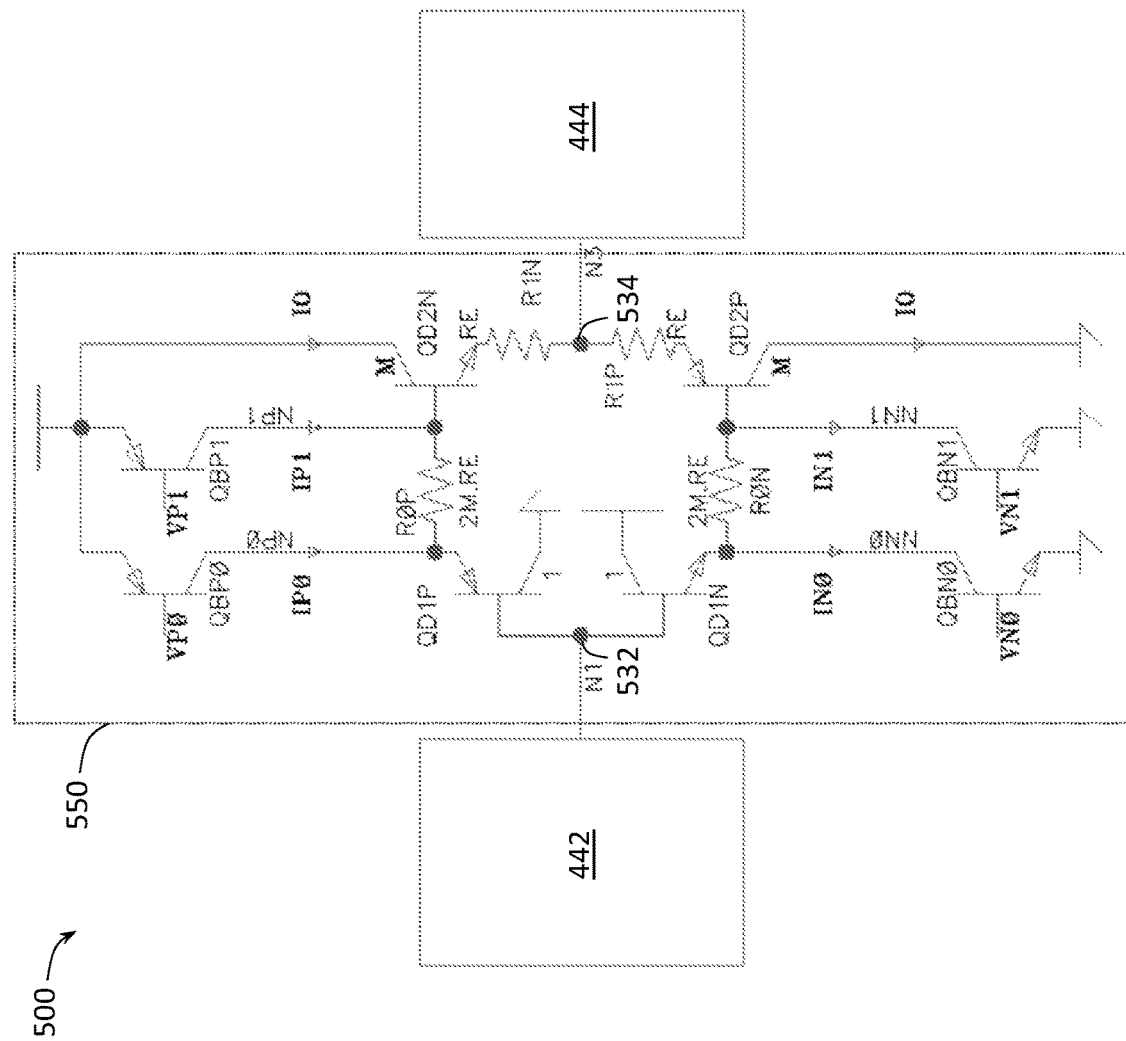
FIG. 5 provides an electric circuit diagram of a bipolar implementation of a current mirror arrangement with an adjustable offset buffer with a diamond stage, according to some embodiments of the disclosure.

FIG. 5 provides an electric circuit diagram of a bipolar implementation of a current mirror arrangement 500 with a buffer amplifier circuit implemented as an adjustable offset buffer 550 with a diamond stage, according to some embodiments of the disclosure. In some embodiments, the buffer 550 may be implemented instead of the buffer 430 in a current mirror arrangement as shown in FIG. 4, i.e., with the base 114 of the input transistor Q1 (or, more generally, with the first terminal of the input transistor Q1 of a current mirror circuit) coupled to an input 532 of the buffer 550, while an output 534 of the buffer 550 is coupled to the base 124 of the output transistor Q2 (or, more generally, with the first terminal of the output transistor Q2 of the current mirror circuit). The input 532 of the buffer 550 may be coupled to the master side 442 of the current circuit arrangement 500, with the details of the master side 442 not specifically shown in FIG. 5, but which could be implemented similar to the master side 442 shown in FIG. 4. The output 534 of the buffer 550 may be coupled to the slave side 444 of the current circuit arrangement 500, with the details of the slave side 444 not specifically shown in FIG. 5, but which could be implemented similar to the slave side 444 shown in FIG. 4. Thus, the current mirror circuit of the current mirror arrangement 500 may include the input transistor Q1 and the output transistor Q2 as described with reference to FIG. 4, and the buffer amplifier circuit of the current mirror arrangement 500 may be implemented as the buffer 550, shown in FIG. 5, the details of which will now be described.

In some embodiments, adjustable offset buffer may be realized by implementing the buffer 550 as a diamond buffer that includes a plurality of transistors and by further including what may be referred to as a "buffer offset reduction circuit," configured to adjust bias currents provided by different current sources to individual transistors of the plurality of transistors of the diamond buffer so that a voltage difference between the output and the input of the buffer amplifier 550 (i.e., the buffer offset) is below a target value.

As shown in FIG. 5, in some embodiments, the plurality of transistors of the diamond buffer may include transistors QD1P and QD1N, forming what may be referred to as a "first stage" of the diamond buffer, and may further include transistors QD2N and QD2P, forming what may be referred to as a "second stage" of the diamond buffer. In some embodiments, as shown in FIG. 5, the transistors of the first stage may be arranged to form an emitter follower, while the transistors of the second stage may be arranged to form a class-ab buffer. The transistors QD1P and QD2P may be P-type transistors, e.g., PNP transistors for the bipolar implementation such as the one shown in FIG. 5, or may be PMOS transistors for the FET implementation of the buffer 550 (not specifically shown in the present drawings). The transistors QD1N and QD2N may be N-type transistors, e.g., NPN transistors for the bipolar implementation such as the one shown in FIG. 5, or may be NMOS transistors for the FET implementation of the buffer 550 (not specifically shown in the present drawings). To be applicable to both bipolar and FET implementations, transistor terminals of the buffer 550 are referred to as first, second, and third terminals in accordance with the use of these terms that was described above. Thus, the first terminals of the transistors QD1P and QD1N may be coupled to one another and both be coupled to the input 532 of the buffer 550, while the second terminals of the transistors QD1P and QD1N may be coupled to the supply and ground potential, as shown in FIG. 5. The second terminals of the transistors QD2N and QD2P may be coupled to the supply and ground voltage, as shown in FIG. 5, while the third terminals of the transistors QD2N and QD2P may be coupled to one another and to the output 534 of the buffer 550. In some embodiments, the third terminal of the transistor QD2N may be coupled to the output 534 via a resistor R1N, while the third terminal of the transistor QD2P may be coupled to the output 534 via a resistor R1P, as shown in FIG. 5. The first terminals of the transistors QD2N and QD2P may be coupled to the third terminals of the transistors QD1P and QD1N, respectively.

In some embodiments, the first terminal of the transistor QD2N may be coupled to the third terminal of the transistor QD1P via a resistor R0P, while the first terminal of the transistor QD2P may be coupled to the third terminal of the transistor QD1N via a resistor R0N, as shown in FIG. 5. In some embodiments, the values of the resistors R1N and R1P may be substantially equal, e.g., as denoted by a value RE illustrated near these resistors in the buffer 550 shown in FIG. 5. In some embodiments, the values of the resistors R0N and R0P may also be substantially equal and may be about 2M times than the value of the resistor R1N (or the resistor R2N), e.g., as denoted by a value 2M·RE illustrated near the resistors R1N and R2N in the buffer 550 shown in FIG. 5. In such embodiments, M may be a positive number greater than 0, indicative of a ratio of an area of the emitter of the transistor QD2N to an area of the emitter of the transistor QD1N when the transistors QD2N and QD1N are bipolar transistors, and indicative of a ratio of an aspect ratio of the transistor QD2N to an aspect ratio of the transistor QD1N when the transistors QD2N and QD1N are FETs. Similar relation may apply to the transistors QD2P and QD1P, i.e., M may be indicative of a ratio of an area of the emitter of the transistor QD2P to an area of the emitter of the transistor QD1P when the transistors QD2P and QD1P are bipolar transistors, and indicative of a ratio of an aspect ratio of the transistor QD2P to an aspect ratio of the transistor QD1P when the transistors QD2P and QD1P are FETs. Thus, although the emitter areas of PNP and NPN transistors of the diamond buffer of the buffer 550 may, and typically would be, different from one another, the relationship in the emitter area of the PNP transistors of the first and second stages of the diamond buffer (i.e., the emitter area of QD2P being M times the emitter area of QD1P) would be substantially the same as the relationship in the emitter area of the NPN transistors of the first and second stages of the diamond buffer (i.e., the emitter area of QD2N being M times the emitter area of QD1N). For the FET implementation of the transistors of the diamond buffer of the buffer 550 this means, that although the aspect ratios of PMOS and NMOS transistors of the diamond buffer of the buffer 550 may, and typically would be, different from one another, the relationship in the aspect ratio of the PMOS transistors of the first and second stages of the diamond buffer (i.e., the aspect ratio of QD2P being M times the aspect ratio of QD1P) would be substantially the same as the relationship in the aspect ratio of the NMOS transistors of the first and second stages of the diamond buffer (i.e., the aspect ratio of QD2N being M times the aspect ratio of QD1N). Coupled with the buffer offset reduction circuit, such dimensions of the P-type and N-type transistors of the diamond buffer and such relations between the resistors R1P, R0P, R1N, and R0N in the buffer 550 may realize the adjustable buffer offset of the buffer 550.

Turning to the buffer offset reduction circuit of the buffer 550, such a circuit may include a plurality of current sources coupled to the plurality of the transistors of the diamond buffer of the buffer 550 and configured to provide bias currents to these transistors. In some embodiments, the current sources of the buffer offset reduction circuit of the buffer 550 may be implemented as transistors, e.g., as transistors having their base/gate voltage controlled to carefully control the current output by the transistors. This is illustrated in FIG. 5 with the current sources coupled to the transistor QD1P being implemented as a first current source in a form of a transistor QBP0 and as a second current source in a form of a transistor QBP1 (i.e., both QBP0 and QBP1 are biasing the transistor QD1P, the sum of the currents from QBP0 and QBP1 being constant, hence, the current to QD1P is constant, and only the ratio of these currents changing depending on parameter α, as described herein). This is illustrated in FIG. 5 with the current sources coupled to the transistor QD1N being implemented as a first current source in a form of a transistor QBN0 and as a second current source in a form of a transistor QBN1 (i.e., both QBN0 and QBN1 are biasing the transistor QD1N, the sum of the currents from QBN0 and QBN1 being constant, hence, the current to QD1N is constant, and only the ratio of these currents changing depending on parameter α, as described herein). In some embodiments, the transistors QBP0 and QBP1 may be P-type transistors, e.g., PNP transistors as shown in FIG. 5, where the first terminal of each of the transistors QBP0 and QBP1 is coupled to a respective different voltage source configured to apply, respectively, voltages VP0 and VP1 to the first terminals of the transistors QBP0 and QBP1. The second terminal of the transistor QBP0 may be coupled to the third terminal of the transistor QD1P, while the third terminal of the transistor QBP0 may be coupled to the supply voltage. The second terminal of the transistor QBP1 may be coupled to the first terminal of the transistor QD2N, while the third terminal of the transistor QBP1 may be coupled to the supply voltage. In some embodiments, the transistors QBN0 and QBN1 may be N-type transistors, e.g., NPN transistors as shown in FIG. 5, where the first terminal of each of the transistors QBN0 and QBN1 is coupled to a respective different voltage source configured to apply, respectively, voltages VN0 and VN1 to the first terminals of the transistors QBN0 and QBN1. The second terminal of the transistor QBN0 may be coupled to the third terminal of the transistor QD1N, while the third terminal of the transistor QBN0 may be coupled to the ground potential. The second terminal of the transistor QBN1 may be coupled to the first terminal of the transistor QD2P, while the third terminal of the transistor QBN1 may be coupled to the ground potential. Thus, the current sources QBP0, QBN0, QBP1, and QBN2 can be configured to provide bias currents to the first stage transistors of the diamond buffer of the buffer 550, with two different current sources coupled to each of the two first stage transistors. Coupling each of the first stage transistors of the diamond buffer to two different current sources allows modifying the distribution of the total bias current between the different current sources so that the buffer offset of the buffer 550 is below a target value. The resistor R0P may be coupled so that one terminal of the resistor R0P is coupled to the third terminal of the transistor QD1P and to the current source QBP0 (e.g., to the second terminal of the transistor QBP0), while the other terminal of the resistor R0P is coupled to the first terminal of the transistor QD2N and to the current source QBP1 (e.g., to the second terminal of the transistor QBP1). Similarly, the resistor R0N may be coupled so that one terminal of the resistor R0N is coupled to the third terminal of the transistor QD1N and to the current source QBN0 (e.g., to the second terminal of the transistor QBN0), while the other terminal of the resistor R0N is coupled to the first terminal of the transistor QD2P and to the current source QBN1 (e.g., to the second terminal of the transistor QBN1). By controlling the control signals VP0, VN0, VP1, and VN1 applied to, respectively, the transistors QBP0, QBN0, QBP1, and QBN1 may be configured to output currents such that a voltage difference between the output and the input of the buffer amplifier (i.e., the buffer offset) is below a target value.

In order to reduce the buffer offset of the buffer 550, the current sources QBP0, QBN0, QBP1, and QBN2 may be controlled to generate currents that have a certain relation between one another. In particular, considering that the current generated by the current source QBP0 may be denoted as IP0, the current generated by the current source QBN0 may be denoted as IN0, the current generated by the current source QBP1 may be denoted as IP1 and the current generated by the current source QBN1 may be denoted as IN1, the current sources QBP0, QBN0, QBP1, and QBN2 may be controlled so that $$IN0=IP1, \quad (1)$$

$$IN1=IP0, \text{ and} \quad (2)$$

$$IN0+IN1=IP0+IP1=IB_{BAC} \quad (3)$$

The current $IB_{BAC}$ in the equation (3) is a bias current for the buffer amplifier circuit 550, which may, but in general, does not have to be, the same as the bias current $IB_{CAM}$ for the current mirror arrangement 500. The current $IB_{BAC}$ is the current at the third terminal of the transistor QD1P and QD1N, which may also be the current at the second terminal of the transistor QD1P and QD1N.

Equations (1)-(3) make clear that a parameter α may be defined that sets the percentage of the bias current $IB_{BAC}$ being in each of IN0 and IN1, and in each of IP0 and IP1. For example, defining the parameter α as a portion of the bias current $IB_{BAC}$ provided as IN0, equations (1)-(3) may be re-written as follows:

$$IN0 = \alpha \cdot IB_{BAC}, \quad (4)$$

$$IN1 = (1-\alpha) \cdot IB_{BAC}, \quad (5)$$

$$IP0 = (1-\alpha) \cdot IB_{BAC}, \text{ and} \quad (6)$$

$$IP1 = \alpha \cdot IB_{BAC}. \quad (7)$$

Analysis of the buffer 550 reveals that the buffer offset $V_{N1,N3}$, i.e., the difference in the voltage $V_{N1}$ at the input 532 (node N1, labeled in FIG. 5) and the voltage $V_{N3}$ at the output 534 (node N3, labeled in FIG. 5) of the buffer 550 is a function of the parameter α and a function of the resistance values of the resistors R0P, R0N, R1P, and R1N, described above, and may be written as follows:

$$V_{N1,N3} = V_T \ln(I_{S\_N}/I_{S\_P}) + RE \cdot M \cdot IB_{BAC} \cdot (2 \cdot \alpha - 1), \quad (8)$$

where $V_T$ is the thermal voltage (which is approximately 0.0258563 Volts at 300 degrees Kelvin and may be computed for other temperatures in terms of the temperature and the Boltzmann constant), $I_{S\_N}$ is the reverse saturation current of the NPN transistors of the diamond buffer portion of the buffer 550 (i.e., transistors QD1N and QD2N), and $I_{S\_P}$ is the reverse saturation current of the PNP transistors of the diamond buffer portion of the buffer 550 (i.e., transistors QD1P and QD2P). Analysis of the buffer 550 further reveals that, if the current $IB_{BAC}$ is the current of QD1P and QD1N of the buffer 550, then the current at the output of the buffer 550, e.g., the current at the second terminal of the transistor QD2N and QD2P is substantially equal to M times of the current $IB_{BAC}$.

Analysis of the equation (8) reveals that if the NPN and the PNP transistors of the diamond buffer portion of the buffer 550 are matched (i.e., if $I_{S\_N}$ is equal to $I_{S\_P}$), then the buffer offset may be eliminated (i.e., $V_{N1,N3}=0$) if α is equal to 0.5. Since α is a value between (and including) 0 and 1 (i.e., 0≤α≤1), when the NPN and the PNP transistors of the diamond buffer portion of the buffer 550 are matched, setting α to a particular value may be used to define the amount of buffer offset anywhere in the range between (and including) $-RE \cdot M \cdot IB_{BAC}$ and $RE \cdot M \cdot IB_{BAC}$ (i.e., $-RE \cdot M \cdot IB_{BAC} \leq V_{N1,N3} \leq RE \cdot M \cdot IB_{BAC}$). If, on the other hand, the NPN and the PNP transistors of the diamond buffer portion of the buffer 550 are not matched (i.e., if $I_{S\_N}$ is not equal to $I_{S\_P}$), then the buffer offset may be eliminated by setting α to a value that would result in the buffer offset being equal to 0. Thus, adjusting the value of α, i.e., adjusting how much of a total bias current $IB_{BAC}$ is in the current IN0 and how much is in the current IN1 (or, equivalently, how much of the total bias current $IB_{BAC}$ is in the current IP0 and how much is in the current IP1), can adjust the amount of the buffer offset of the buffer 550. In turn, adjusting the current IN0, IN1, IP0, and IP1 may be done by controlling the voltages VN0, VN1, VP0, and VP1, respectively. In general, the voltages VN0, VN1, VP0, and VP1 of values corresponding to, respectively, the current sources QBN0, QBN1, QBP0, and QBP1 producing the currents IN0, IN1, IP0, and IP1 as described herein may be generated using any circuit or logic component. FIG. 7 illustrates one example circuit that may be used, in context of a differential current mirror arrangement of FIG. 6, to generate the voltages VN0, VN1, VP0, and VP1 so that the currents IN0, IN1, IP0, and IP1 are defined so as to eliminate the buffer offset of the buffer 550.

To summarize the above description of the relations between the currents, the current sources QBP0, QBN0, QBP1, and QBN1 are configured to output currents such that 1) a current IP0, output by the current source QBP0, is substantially equal to a current IN1, output by the current source QBN1, 2) a current IP1, output by the current source QBP1, is substantially equal to a current IN0, output by the current source QBN0, and 3) a sum of the current IN0 and the current IN1 is substantially equal to a sum of the current IP0 and the current IP1 (where each of the sums is denoted as the bias current $IB_{BAC}$). The bias current $IB_{BAC}$ is the bias current of the emitter follower first stage of the diamond buffer circuit of the buffer 550. The degeneration resistors RE and 2M·RE may help ensure that the bias current of the class-AB second stage of the diamond buffer circuit of the buffer 550 is equal to M times $IB_{BAC}$. In such configuration, a proportion of the current IP0 in the $IB_{BAC}$ (i.e., a proportion of the current IP0 in the sum of the current IP0 and the current IP1, or, equivalently, one or more of: a proportion of the current IP1 in the sum of the current IP0 and the current IP1, a proportion of the current IN0 in the sum of the current IN0 and the current IN1, and a proportion of the current IN1 in the sum of the current IN0 and the current IN1) may be selected so that a voltage difference between the output 534 and the input 532 of the buffer amplifier circuit 550 (the voltage difference being the buffer offset $V_{N1,N3}$) is below a target value. The transistors QD1P, QD1N, QD2P, and QD2N may be coupled to one another so that 1) the current IP0 is combined with the current IP1 at the third terminal of the transistor QD1P (i.e., the current at the third terminal of QD1P is the current $I_{BAC}$), and 2) the current IN0 is combined with the current IN1 at the third terminal of the transistor QD1N (i.e., the current at the third terminal of QD1N is also $I_{BAC}$). Furthermore, 1) the first terminal of the transistor QD2N may be coupled to the third terminal of the transistor QD1P and the current source QBP1 may be coupled to the third terminal of the transistor QD1P, and 2) the first terminal of the transistor QD2P may be coupled to the third terminal of the transistor QD1N and the current source QBN1 may be coupled to the third terminal of the transistor QD1N.

FIG. 5 illustrates a single-ended current mirror arrangement. In some embodiments, current mirror arrangements with adjustable buffers between the transistors Q1 and Q2 of the current mirror may be implemented as differential-signal circuits. Some such embodiments are shown in FIGS. 6 and 8-11. The differential-signal embodiments may be particularly advantageous in that they may be particularly suitable for performing buffer offset adjustment by exploiting the differential nature of the signals.

Figure 6:
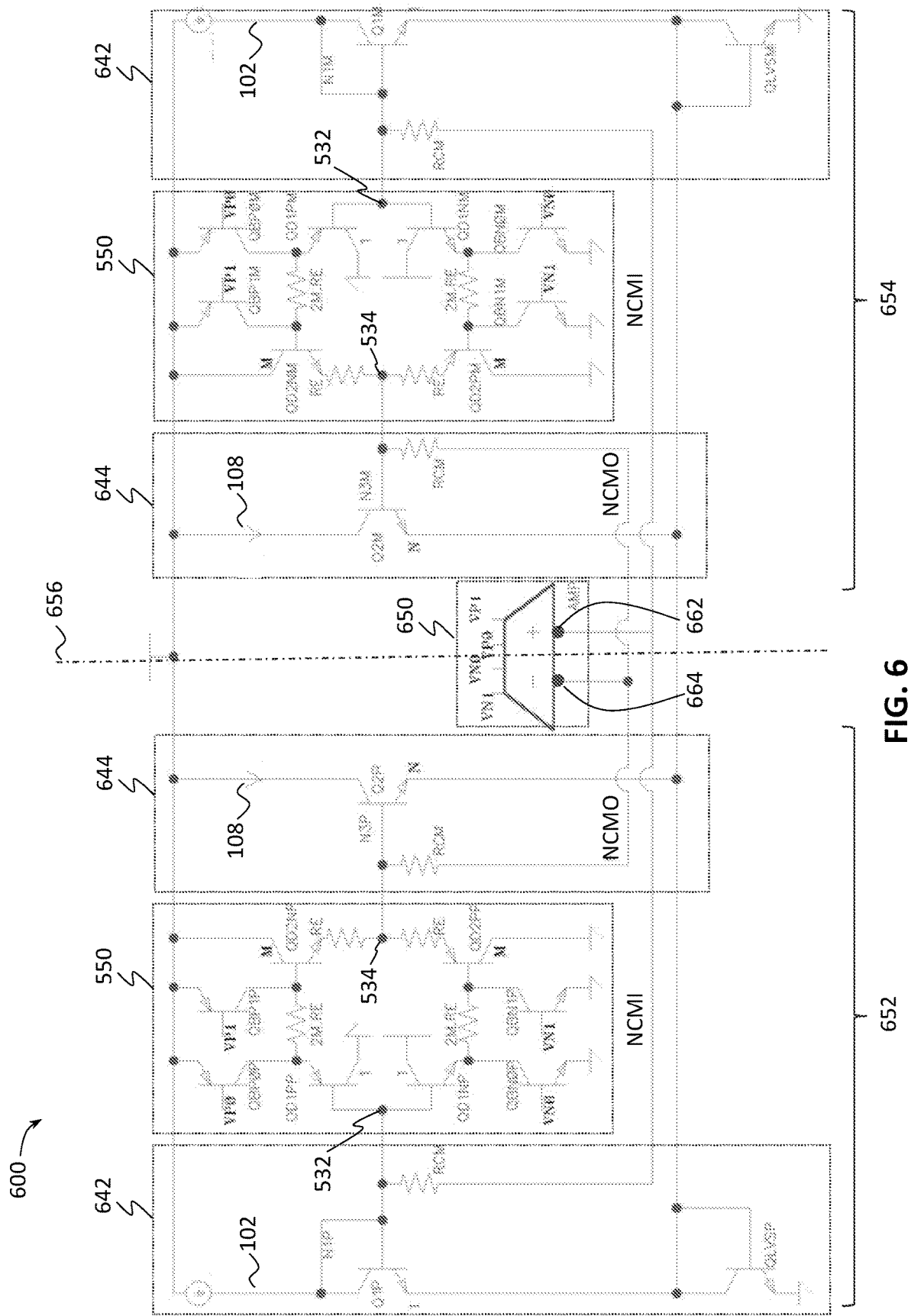
FIG. 6 provides an electric circuit diagram of a differential current mirror arrangement implementing the current mirror arrangement with the adjustable offset buffer of FIG. 5 in each of the differential portions, according to some embodiments of the disclosure.
Figure 7:
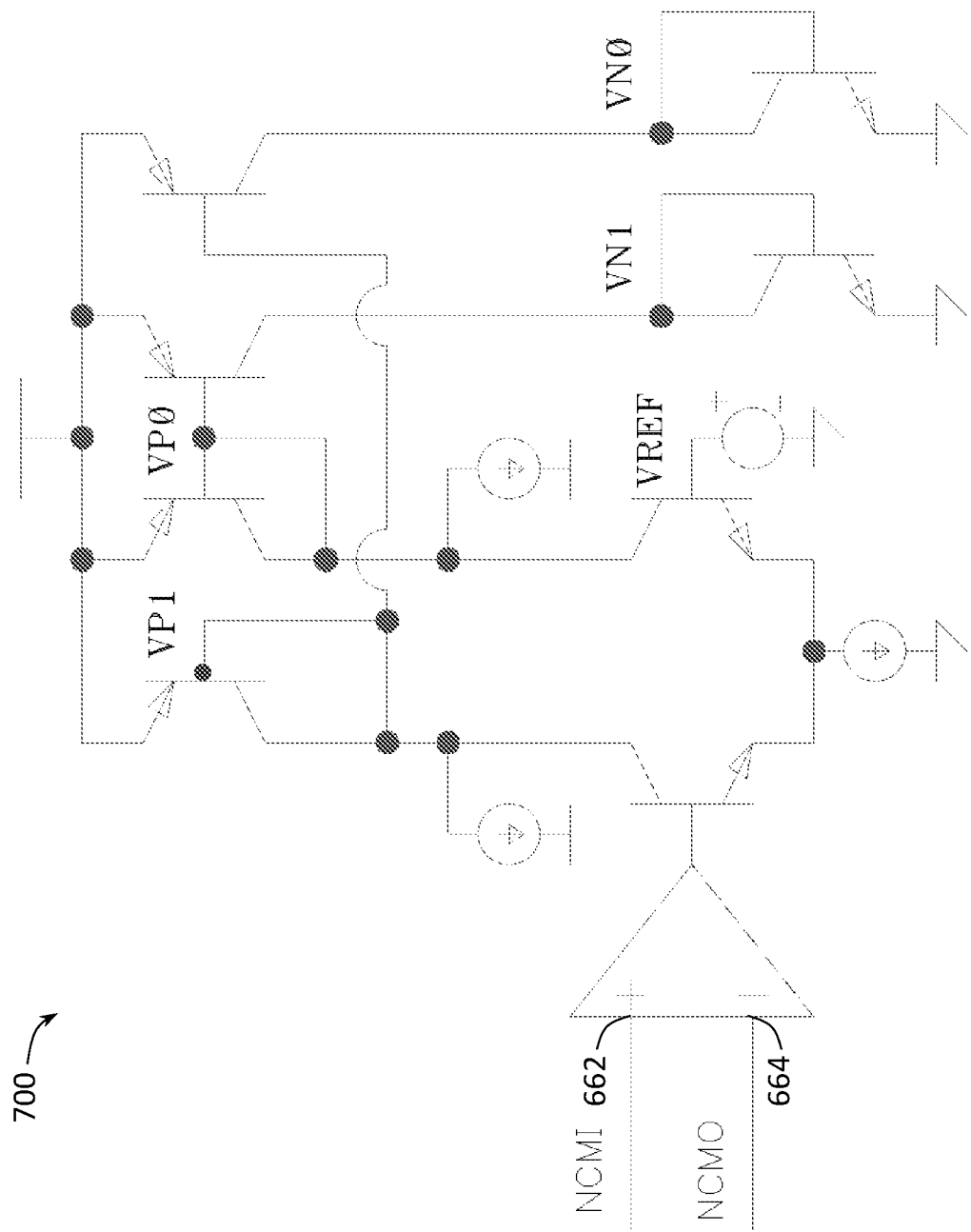
FIG. 7 provides an electric circuit diagram of an amplifier arrangement for providing control signals for the current mirror arrangements of FIGS. 5 and/or 6, according to some embodiments of the disclosure.

FIG. 6 provides an electric circuit diagram of a differential current mirror arrangement 600 in which the adjustable offset buffer 550 as shown in FIG. 5 may be implemented, according to some embodiments of the disclosure. Since the current mirror arrangement 600 is differential, it includes two portions configured to receive complementary input signals, shown in FIG. 6 as a first portion 652 and a second portion 654, illustrated in FIG. 6 to be, respectively, to the left and to the right of a vertical dashed-dotted line 656. In some embodiments, the first portion 652 may receive the input signal 102 in the form of a first input current $I_{INP}$ that is based on a sum of a bias current $IB_{CMA}$ for the current mirror arrangement 600 and a signal current $I_{IN}$ (e.g., $I_{INP}=IB_{CMA}+I_{IN}$), while the second portion 654 may receive the input signal in the form of a second input current $I_{INM}$ that is based on a difference between the bias current $IB_{CMA}$ and the signal current $I_{IN}$ (e.g., $I_{INM}=IB_{CMA}-I_{IN}$) Thus, the first portion 652 may be referred to as a "positive signal path side" and the second portion 654 may be referred to as a "negative signal path side." In such embodiments, the output current 108 of the first portion 652 may be $I_{OP}=K^*I_{INP}$, while the output current 108 of the second portion 654 may be $I_{OM}=K^*I_{INM}$. Thus, for each portion 652, 654 of the differential current mirror arrangement 600, a ratio of the output signal 108 to the input signal 104 may be substantially equal to K, where K is a current gain as described above.

Each of the first and second portions 652, 654 may include substantially the current mirror arrangement 500 as described with reference to FIG. 5, except for a few differences which will now be described.

First of all, the portion 654 is shown in FIG. 6 to be a mirror reflection of the portion 652. This may be done for the ease of illustration and, in general, the layout of the electric circuit diagram shown in FIG. 6, as well as in other drawings of the present disclosure, may not have any relation to the layout of the actual components of an IC circuit in a product.

Second, in order to not clutter the drawing of FIG. 6, the first terminal (base), the second terminal (collector), and third terminal (emitter) of various transistors are not specifically labeled with reference numerals (but which terminal is which is clear from the electrical circuit diagram notation used in FIG. 6, as well as in other drawings of the present disclosure, to show the transistors).

Third, each of the first and second portions 652, 654 includes a master side 642 and a slave side 644, similar to the master side 442 and the slave side 444, respectively, and further includes the adjustable offset buffer 550 having the input 532 coupled to the master side 642 and having the output 534 coupled to the slave side 644 (similar to the coupling shown in FIG. 5). Thus, the first portion 652 includes a first instance of the adjustable offset buffer 550 as shown in FIG. 5, the buffer 550 of the first portion 652 having the input 532 coupled to the master side 642 of the first portion 652 and having the output 534 coupled to the slave side 644 of the first portion 652. Similarly, the second portion 654 includes a second instance of the adjustable offset buffer 550 as shown in FIG. 5, the buffer 550 of the second portion 654 having the input 532 coupled to the master side 642 of the second portion 654 and having the output 534 coupled to the slave side 644 of the second portion 654.

For each of the portions 652, 654, the master side 642 is similar to the master side 442, described above, with a few differences. One difference is that the input transistor Q1 of the current mirror circuit of the current mirror arrangement 600 is labeled as an input transistor Q1P for the first portion 652 and as an input transistor Q1M for the second portion 654. Another difference is that the master side 642 of the first portion 652 may further include a transistor QLVSP and the master side 642 of the second portion 654 may further include a transistor QLVSM. For each of the transistors QLVSP and QLVSM, their first terminal may be coupled to their second terminal, as shown in FIG. 6. Such transistors QLVSP and QLVSM may be included in some embodiments to provide headroom to the transistors QBN0P and QBN1P by shifting the input voltage level one $V_{BE}$ level higher, where, in this context, the voltage $V_{BE}$ is the base-emitter voltage of the transistors QLVSP and QLVSM. Because of the differential nature of the input signal, the collector/second terminals of the transistors QLVSP and QLVSM is AC ground. Yet another difference is that the master side 642 in each of the portions 652, 654 further includes a resistor RCM (where "RCM" stands for "Resistor Common-Mode"), having a first terminal coupled to the first terminal of the input transistor Q1 of the portion and the input 532 of the buffer 550 of that portion, and having a second terminal coupled to a first (e.g., positive) input 662 of an amplifier 650, shared between the first and second portions 652, 654. Thus, for the first portion 652, the first terminal of the input transistor Q1P and the input 532 of the buffer 550 of the portion 652 are coupled to the first input 662 of the amplifier 650 (said coupling labeled in FIGS. 6 and 7 as a node NCMI), via the resistor RCM. Similarly, for the second portion 654, the first terminal of the input transistor Q1M and the input 532 of the buffer 550 of the portion 654 are also coupled to the first input 662 of the amplifier 650 (also the node NCMI), via the resistor RCM. The second terminal of the resistor RCM of the master side 642 of the first portion 652 is coupled to the second terminal of the resistor RCM of the master side 642 of the second portion 654, and both of them coupled to the first input 662 of the amplifier 650, as shown in FIG. 6.

For each of the portions 652, 654, the slave side 644 is similar to the slave side 444, described above, also with a few differences. One difference is that the output transistor Q2 of the current mirror circuit of the current mirror arrangement 600 is labeled as an output transistor Q2P for the first portion 652 and as an output transistor Q2M for the second portion 654. Another difference is that the slave side 644 in each of the portions 652, 654 further includes a resistor RCM, having a first terminal coupled to the first terminal of the output transistor Q2 of the portion and the output 534 of the buffer 550 of that portion, and having a second terminal coupled to a second (e.g., negative) input 664 of the amplifier 650. Thus, for the first portion 652, the first terminal of the output transistor Q2P and the output 534 of the buffer 550 of the portion 652 are coupled to the second input 664 of the amplifier 650 (said coupling labeled in FIGS. 6 and 7 as a node NCMO), via the resistor RCM. Similarly, for the second portion 654, the first terminal of the output transistor Q2M and the output 534 of the buffer 550 of the portion 654 are also coupled to the second input 664 of the amplifier 650 (also the node NCMO), via the resistor RCM. The second terminal of the resistor RCM of the slave side 644 of the first portion 652 is coupled to the second terminal of the resistor RCM of the slave side 644 of the second portion 654, and both of them coupled to the second input 664 of the amplifier 650, as shown in FIG. 6.

The resistors RCM are common-mode resistors, included to generate the common-mode voltages at the input and the output of the buffers 550. In particular, the common-mode voltage $V_{NCMI}$ at the input of the buffers 550 may be generated through the resistors RCM at the node NCMI (where "NCMI" stands for "Node Common-Mode Input"), while the common-mode voltage $V_{NCMO}$ at the output of the buffers 550 may be generated through the resistors RCM at the node NCMO (where "NCMO" stands for "Node Common-Mode Output"). The NCMI and NCMO voltages are AC ground due to the differential nature of the current mirror arrangement 600. The common-mode voltages $V_{NCMI}$ and $V_{NCMO}$ are provided to the amplifier 650, namely, the common-mode voltage $V_{NCMI}$ may be provided to the first input 662 of the amplifier 650 while the common-mode voltage $V_{NCMO}$ may be provided to the second input 664 of the amplifier 650. Thus, the amplifier 650 may detect the buffer offset as the difference between the common-mode voltages $V_{NCMI}$ and $V_{NCMO}$.

FIG. 7 provides an electric circuit diagram of an amplifier arrangement 700 for providing control signals for the current mirror arrangements of FIGS. 5 and/or 6, according to some embodiments of the disclosure. The amplifier arrangement 700 may be used as the amplifier 650 in the current mirror arrangement of FIG. 6 to generate the voltages VN0, VN1, VP0, and VP1 so that the currents IN0, IN1, IP0, and IP1 are defined so as to reduce or eliminate the buffer offset of the buffer 550. To that end, the amplifier arrangement 700 may include an amplifier 702 (which may be implemented using any known amplifier design), as well as a plurality of transistors and current sources, coupled to one another as shown in FIG. 7, so that, when the amplifier 702 receives the common-mode voltages from the nodes NCMI and NCMO as the inputs 662, 664 (e.g., receives the voltage $V_{NCMI}$ from the node NCMI at the positive input 662 and receives the voltage $V_{NCMO}$ from the node NCMO at the negative input 664), the voltage VN0 is generated at the node labeled in FIG. 7 as VN0, the voltage VN1 is generated at the node labeled in FIG. 7 as VN1, the voltage VP0 is generated at the node labeled in FIG. 7 as VP0, and the voltage VP1 is generated at the node labeled in FIG. 7 as VP1.

Adjustable Offset Buffer with an Input Side Offset Adjustment

Figure 8:
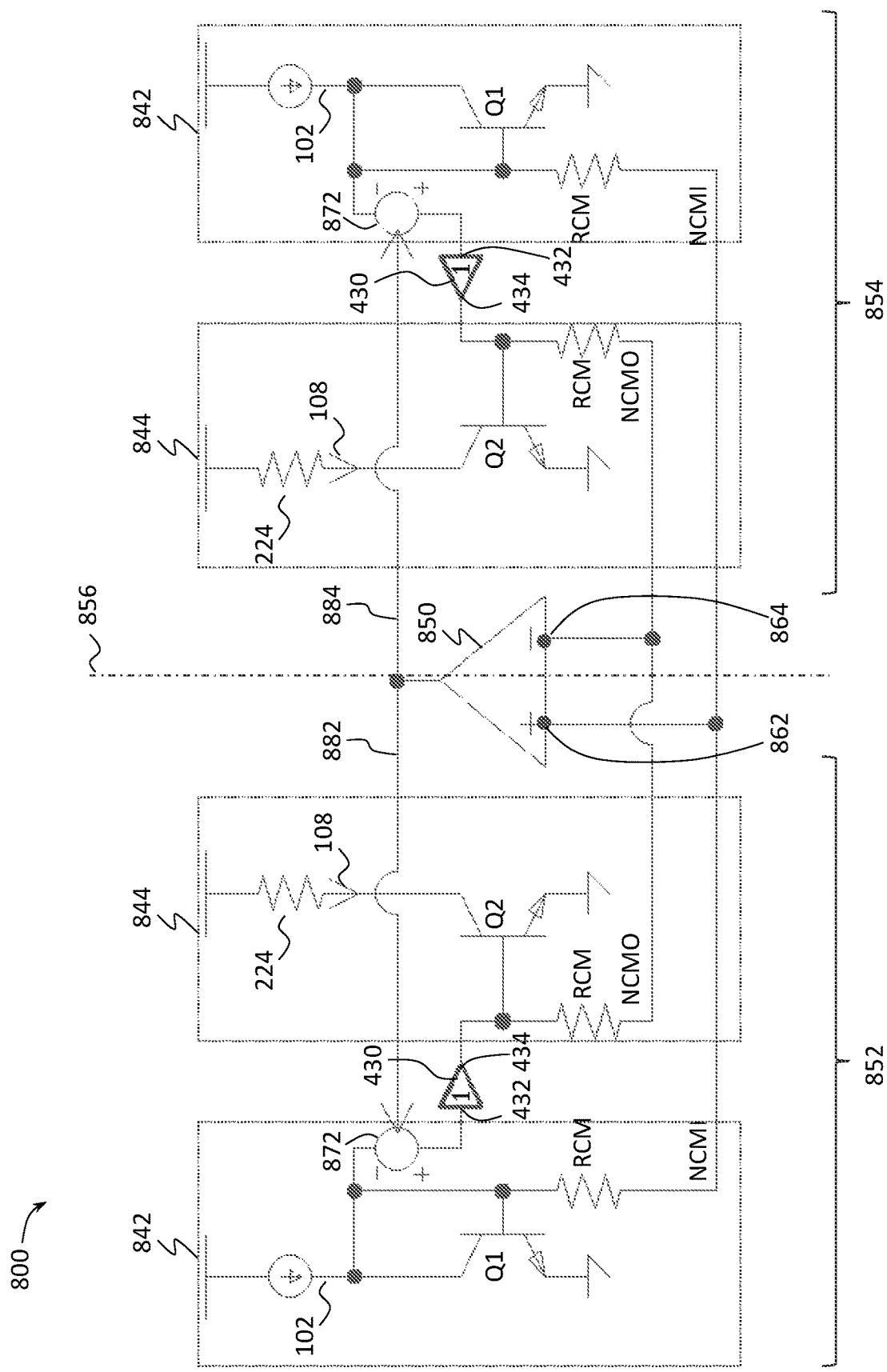
FIG. 8 provides an electric circuit diagram of an NPN implementation of a differential current mirror arrangement with an adjustable offset buffer with an input side offset adjustment, according to some embodiments of the disclosure.
Figure 9:
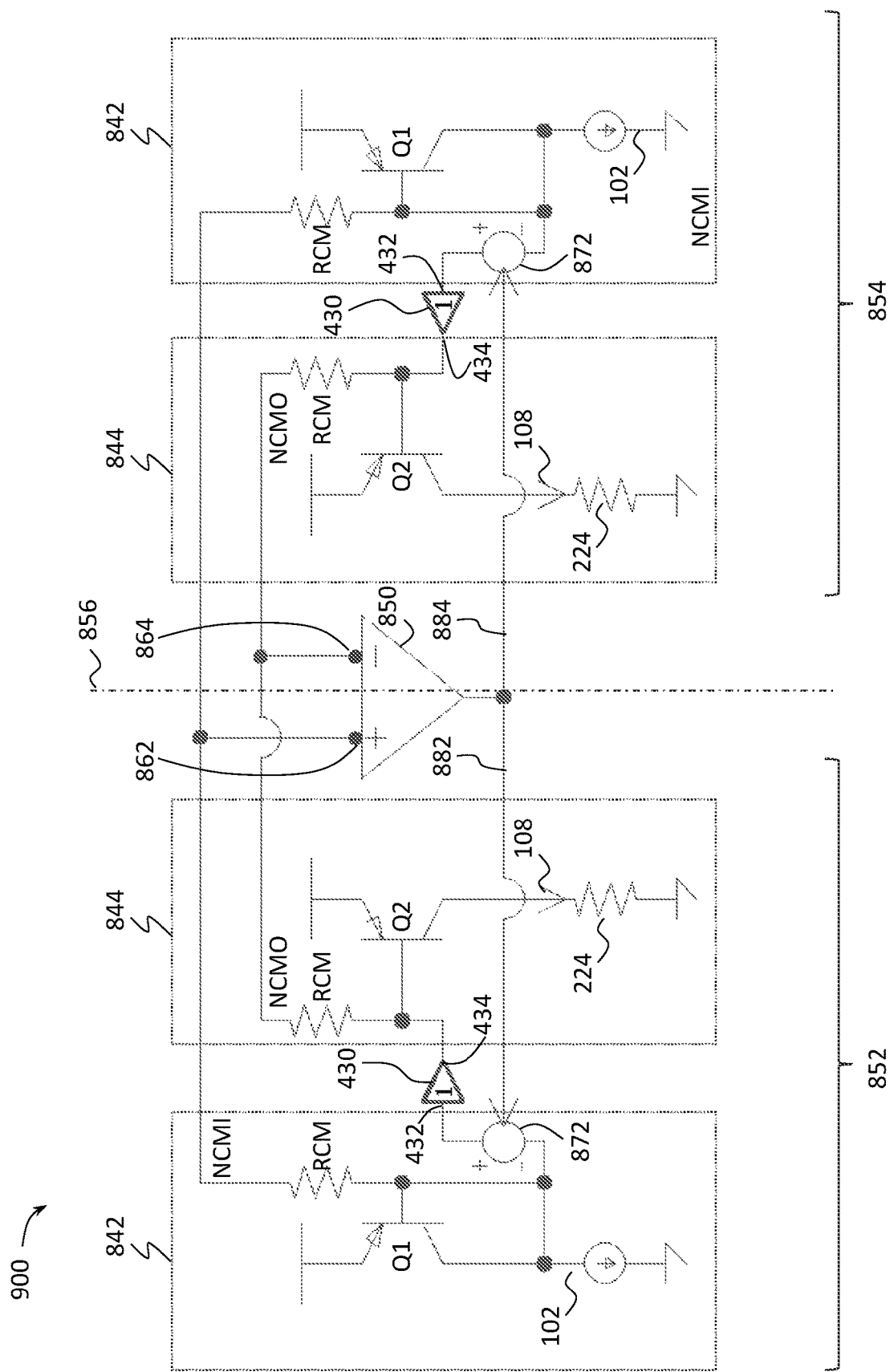
FIG. 9 provides an electric circuit diagram of a PNP implementation of a differential current mirror arrangement with an adjustable offset buffer with an input side offset adjustment, according to some embodiments of the disclosure.

Other differential-signal embodiments of adjustable offset buffers may be implemented using an input side offset adjustment, some examples of which are shown FIGS. 8 and 9.

FIG. 8 provides an electric circuit diagram of an NPN implementation of a differential current mirror arrangement 800 with an adjustable offset buffer with an input side offset adjustment, according to some embodiments of the disclosure.

Since the current mirror arrangement 800 is differential, it includes two portions configured to receive complementary input signals, shown in FIG. 8 as a first portion 852 and a second portion 854, illustrated in FIG. 8 to be, respectively, to the left and to the right of a vertical dashed-dotted line 856. Descriptions provided with respect to the portions 652 and 654 and the input and output currents of these portions provided with respect to FIG. 6 are applicable to the portions 852 and 854 and, therefore, in the interests of brevity, are not repeated.

Similar to the illustration of FIG. 6, the portion 854 is shown in FIG. 8 to be a mirror reflection of the portion 852. This may be done for the ease of illustration and, in general, the layout of the electric circuit diagram shown in FIG. 8, as well as in other drawings of the present disclosure, may not have any relation to the layout of the actual components of an IC circuit in a product. Also similar to the illustration of FIG. 6, in order to not clutter the drawing of FIG. 8, the first terminal (base), the second terminal (collector), and third terminal (emitter) of various transistors are not specifically labeled with reference numerals (but which terminal is which is clear from the electrical circuit diagram notation used in FIG. 8 to show the transistors). Further similar to the illustration of FIG. 6, the differential current mirror arrangement 800 includes an amplifier 850 (similar to the amplifier 650, shown in FIG. 6), shared between the first and second portions 852, 854.

As shown in FIG. 8, each of the first and second portions 852, 854 includes a master side 842 and a slave side 844, and further includes a buffer coupled between the master side 842 and the slave side 844. In each of the portions 852, 854, the buffer may be the buffer 430 as described with reference to FIG. 4, having the input 432 coupled to the master side 842 and having the output 434 coupled to the slave side 844. Thus, the first portion 852 includes a first instance of the buffer 430, the buffer 430 of the first portion 852 having the input 432 coupled to the master side 842 of the first portion 852 and having the output 434 coupled to the slave side 844 of the first portion 852. Similarly, the second portion 854 includes a second instance of the buffer 430, the buffer 430 of the second portion 854 having the input 432 coupled to the master side 842 of the second portion 854 and having the output 434 coupled to the slave side 844 of the second portion 854.

For each of the portions 852, 854, the master side 842 is similar to the master side 442, described above, except that the master side 842 in each of the portions 852, 854 further includes a resistor RCM and a voltage-controlled voltage source 872. In each of the portions 852, 854, the voltage-controlled voltage source 872 may be seen as having a first terminal coupled to the first and second terminals of the transistor Q1 and having a second terminal coupled to the input 432 of the buffer 430. The voltage-controlled voltage source 872 may be configured to receive a control signal from the amplifier 850. The resistor RCM of the master side 842 in each of the portions 852, 854 is similar to the resistor RCM of the master side 642 in each of the portions 652, 654 of FIG. 6 in that, in FIG. 8, that resistor also has a first terminal coupled to the first terminal of the input transistor Q1 of the portion and has a second terminal coupled to a first (e.g., positive) input 862 of the amplifier 850 via the node NCMI. Because the first terminal of the input transistor Q1 is coupled to the first terminal of the voltage-controlled voltage source 872, the first terminal of the resistor RCM of the master side 842 in each of the portions 852, 854 is also coupled to the first terminal of the voltage-controlled voltage source 872. Thus, for the first portion 852, the first terminal of the input transistor Q1 is coupled to the input 432 of the buffer 430 of the portion 852 via the voltage-controlled voltage source 872 in the portion 852, and the first terminal of the input transistor Q1 is coupled to the first input 862 of the amplifier 850 (said coupling labeled in FIG. 8 as the node NCMI), via the resistor RCM of the master side 842 of the portion 852. Similarly, for the second portion 854, the first terminal of the input transistor Q1 is coupled to the input 432 of the buffer 430 of the portion 854 via the voltage-controlled voltage source 872 in the portion 854, and the first terminal of the input transistor Q1 is coupled to the first input 862 of the amplifier 850 (said coupling labeled in FIG. 8 as the node NCMI), via the resistor RCM of the master side 842 of the portion 854.

For each of the portions 852,654, the slave side 844 is similar to the slave side 444, described above, except that the slave side 844 in each of the portions 852, 854 further includes a resistor RCM. The resistor RCM of the slave side 844 in each of the portions 852, 854 is similar to the resistor RCM of the slave side 644 in each of the portions 652, 654 of FIG. 6 in that, in FIG. 8, that resistor also has a first terminal coupled to the first terminal of the output transistor Q2 of the portion and has a second terminal coupled to a second (e.g., negative) input 864 of the amplifier 850 via the node NCMO. Thus, for the first portion 852, the first terminal of the output transistor Q2 is coupled to the second input 864 of the amplifier 850 (said coupling labeled in FIG. 8 as the node NCMO), via the resistor RCM of the slave side 844 of the portion 852. Similarly, for the second portion 854, the first terminal of the output transistor Q2 is coupled to the second input 864 of the amplifier 850 (said coupling labeled in FIG. 8 as the node NCMO), via the resistor RCM of the slave side 844 of the portion 854.

Similar to the current mirror arrangement 600, the resistors RCM of current mirror arrangement 800 are common-mode resistors, included to generate the common-mode voltages at the input and the output of the buffers 430. In particular, the common-mode voltage $V_{NCMI}$ at the input of the buffers 430 may be generated through the resistors RCM at the node NCMI, while the common-mode voltage $V_{NCMO}$ at the output of the buffers 430 may be generated through the resistors RCM at the node NCMO. The NCMI and NCMO voltages are AC ground due to the differential nature of the current mirror arrangement 800. The common-mode voltages $V_{NCMI}$ and $V_{NCMO}$ are provided to the amplifier 850, namely, the common-mode voltage $V_{NCMI}$ may be provided to the first input 862 of the amplifier 850 while the common-mode voltage $V_{NCMO}$ may be provided to the second input 864 of the amplifier 850. Thus, the amplifier 850 may detect the buffer offset as the difference between the common-mode voltages $V_{NCMI}$ and $V_{NCMO}$. The amplifier 850 may then provide the detected buffer offset to the voltage-controlled voltage sources 872 in the first and second portions 852, 854. In particular, as shown in FIG. 8, the amplifier 850 may provide the detected buffer offset to the voltage-controlled voltage source 872 in the first portion 852 via a control path 882, and to the voltage-controlled voltage source 872 in the second portion 854 via a control path 884. In response to receiving the buffer offset from the amplifier 850, the voltage-controlled voltage source 872 may apply a compensation to the voltage at the first terminal of the input transistor Q1 (coupled to the first terminal of the voltage-controlled voltage source 872) to generate the compensated voltage at the second terminal of the voltage-controlled voltage source 872, coupled to the input 432 of the buffer 430. In this manner, the voltage-controlled voltage source 872 can perform the buffer offset adjustment at the input side of the buffer 430 (i.e., at the input 432 of the buffer 430).

To summarize, the above description makes clear that the "adjustable offset buffer with an input side offset adjustment" of FIG. 8 is realized by, or may be seen as, the buffer 430 which is made into an "adjustable offset buffer" by a combination of the resistors RCM at the nodes NCMI and NCMO and the voltage-controlled voltage source 872 in each of the first and second portions 852, 854, and the amplifier 850 configured to provide the voltage offset to be compensated for, at the input side of the buffer 430, by the voltage-controlled voltage source 872. In other words, the current mirror arrangement 800 may be seen as a differential circuit having the first portion 852 and the second portion 854, where each portion includes a current mirror circuit, a buffer amplifier circuit, and a buffer offset reduction circuit. The current mirror circuit is a circuit formed by the input transistor Q1 and Q2. The buffer amplifier circuit is formed by the buffer 430, the buffer amplifier circuit having the input 432 coupled to the first terminal of the transistor Q1 and the output 434 coupled to the first terminal of the transistor Q2. The buffer offset reduction is a circuit formed by the voltage-controlled voltage source 872, the resistors RCM at the nodes NCMI and NCMO, and the amplifier 850. Such a buffer offset reduction circuit is configured to adjust the voltage at the input 432 of the buffer amplifier circuit so that the voltage difference between the output 434 and the input 432 of the buffer amplifier circuit (i.e., the buffer offset) is zero, or, more generally, so that the voltage difference between the output 434 and the input 432 of the buffer amplifier circuit is below a target value. In some embodiments, the voltage at the input 432 of the buffer amplifier circuit may be adjusted based on the difference between the common-mode voltage at the inputs 432 of the buffer amplifier circuits of the first and second portions 852, 854 (i.e., the voltage $V_{NCMI}$) and the common-mode voltage at the outputs 434 of the buffer amplifier circuits of the first and second portions 852, 854 (i.e., the voltage $V_{NCMO}$).

While the descriptions of the adjustable offset buffer with the input side offset adjustment, provided above, refer to the NPN implementation of the transistors Q1 and Q2 (i.e., with the transistors Q1 and Q2 being implemented as NPN transistors), in other embodiments, the transistors Q1 and Q2 of the current mirror arrangement 800 may be implemented as PNP transistors. FIG. 9 provides an electric circuit diagram of a PNP implementation of a differential current mirror arrangement 900 with an adjustable offset buffer with an input side offset adjustment, according to some embodiments of the disclosure. The current mirror arrangement 900 is substantially analogous to the current mirror arrangement 800 except that each NPN transistor of the current mirror arrangement 800 (i.e., two transistors Q1 and Q2 in each of the first portion 842 and the second portion 844) is replaced with a PNP transistor in the current mirror arrangement 900. In such a configuration, the descriptions provided with reference to FIG. 8 are applicable to the current mirror arrangement 900 except that NPN and PNP transistors are swapped, and supply and current directions are reversed. The designations such as "first/base terminals," "second/collector terminals," and "third/emitter terminals" remain the same. In the interests of brevity, a detailed description of FIG. 9 is not provided because it's substantially analogous to that of FIG. 8 except for the changes identified above.

Adjustable Offset Buffer with an Output Side Offset Adjustment

Figure 10:
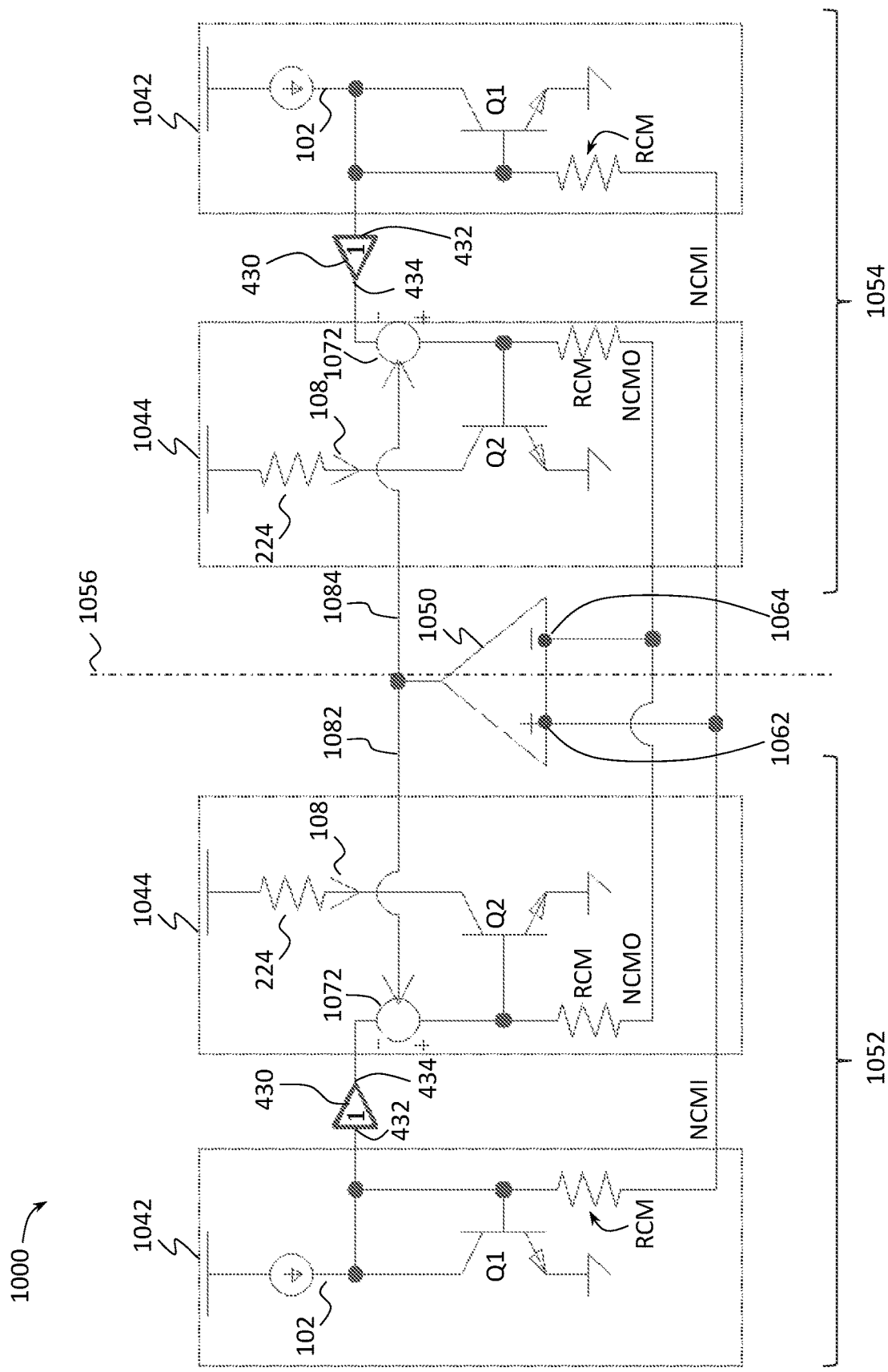
FIG. 10 provides an electric circuit diagram of an NPN implementation of a differential current mirror arrangement with an adjustable offset buffer with an output side offset adjustment, according to some embodiments of the disclosure.
Figure 11:
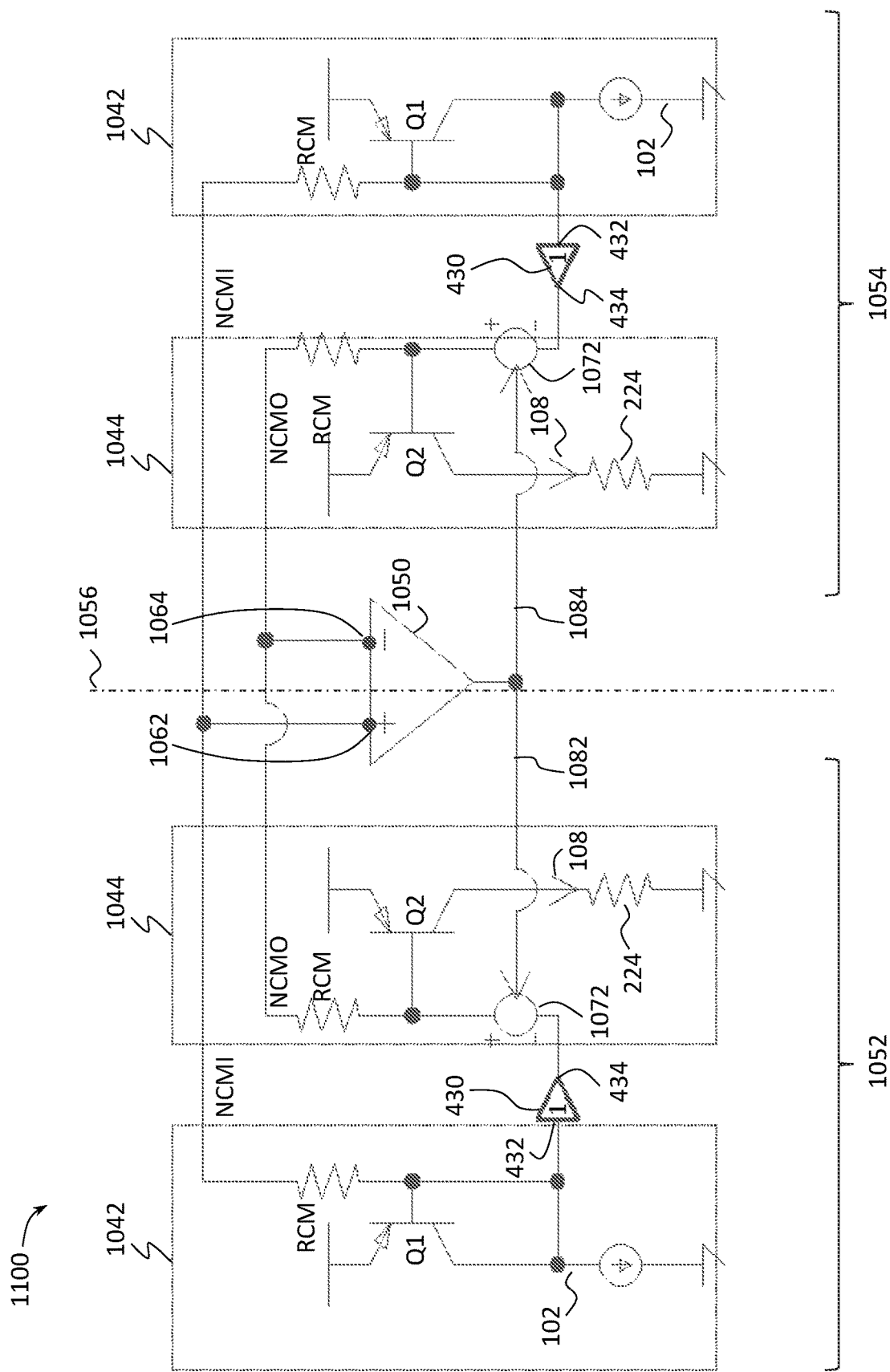
FIG. 11 provides an electric circuit diagram of a PNP implementation of a differential current mirror arrangement with an adjustable offset buffer with an output side offset adjustment, according to some embodiments of the disclosure.

Still further differential-signal embodiments of adjustable offset buffers may be implemented using an output side offset adjustment, some examples of which are shown FIGS. 10 and 11.

FIG. 10 provides an electric circuit diagram of an NPN implementation of a differential current mirror arrangement 1000 with an adjustable offset buffer with an output side offset adjustment, according to some embodiments of the disclosure. The current mirror arrangement 1000 is substantially analogous to the current mirror arrangement 800 except that instead of implementing the voltage-controlled voltage source 872 at the input side of the buffer 430, the current mirror arrangement includes a voltage-controlled voltage source 1072 at the output side of the buffer 430, in each of the first and second portions 1052, 1054.

For each of the portions 1052, 1054, the master side 1042 is similar to the master side 442, described above, except that the master side 1042 in each of the portions 1052, 1054 further includes a resistor RCM. The resistor RCM of the master side 1042 in each of the portions 1052, 1054 is similar to the resistor RCM of the master side 642 in each of the portions 652, 654 of FIG. 6 in that, in FIG. 10, that resistor also has a first terminal coupled to the first terminal of the input transistor Q1 of the portion and has a second terminal coupled to a first (e.g., positive) input 1062 of the amplifier 1050 via the node NCMI. Thus, for the first portion 1052, the first terminal of the input transistor Q1 is coupled to the first input 1062 of the amplifier 1050 (said coupling labeled in FIG. 10 as the node NCMI), via the resistor RCM of the master side 1042 of the portion 1052. Similarly, for the second portion 1054, the first terminal of the input transistor Q1 is coupled to the first input 1062 of the amplifier 1050 (said coupling labeled in FIG. 10 as the node NCMI), via the resistor RCM of the master side 1042 of the portion 1054.

For each of the portions 1052,654, the slave side 1044 is similar to the slave side 444, described above, except that the slave side 1044 in each of the portions 1052, 1054 further includes a resistor RCM and a voltage-controlled voltage source 1072. The resistor RCM of the slave side 1044 in each of the portions 1052, 1054 is similar to the resistor RCM of the slave side 644 in each of the portions 652, 654 of FIG. 6 in that, in FIG. 10, that resistor also has a first terminal coupled to the first terminal of the output transistor Q2 of the portion and has a second terminal coupled to a second (e.g., negative) input 1064 of the amplifier 1050 via the node NCMO. In each of the portions 1052, 1054, the voltage-controlled voltage source 1072 may be seen as having a first terminal coupled to the first terminal of the output transistor Q2 and having a first terminal coupled to the output 434 of the buffer 430. The voltage-controlled voltage source 1072 may be configured to receive a control signal from the amplifier 1050. Because the first terminal of the output transistor Q2 is coupled to the first terminal of the voltage-controlled voltage source 1072, the first terminal of the resistor RCM of the slave side 1044 in each of the portions 1052, 1054 is also coupled to the first terminal of the voltage-controlled voltage source 1072. Thus, for the first portion 1052, the first terminal of the output transistor Q2 is coupled to the output 434 of the buffer 430 of the portion 1052 via the voltage-controlled voltage source 1072 in the portion 1052, and the first terminal of the output transistor Q2 is coupled to the second input 1064 of the amplifier 1050 (said coupling labeled in FIG. 10 as the node NCMO), via the resistor RCM of the slave side 1044 of the portion 1052. Similarly, for the second portion 1054, the first terminal of the output transistor Q2 is coupled to the output 434 of the buffer 430 of the portion 1054 via the voltage-controlled voltage source 1072 in the portion 1054, and the first terminal of the output transistor Q2 is coupled to the second input 1064 of the amplifier 1050 (said coupling labeled in FIG. 10 as the node NCM)), via the resistor RCM of the slave side 1044 of the portion 1054.

Similar to the current mirror arrangements 600 and 800, the resistors RCM of current mirror arrangement 1000 are common-mode resistors, included to generate the common-mode voltages at the input and the output of the buffers 430. In particular, the common-mode voltage $V_{NCMI}$ at the input of the buffers 430 may be generated through the resistors RCM at the node NCMI, while the common-mode voltage $V_{NCMO}$ at the output of the buffers 430 may be generated through the resistors RCM at the node NCMO. The NCMI and NCMO voltages are AC ground due to the differential nature of the current mirror arrangement 1000. The common-mode voltages $V_{NCMI}$ and $V_{NCMO}$ are provided to the amplifier 1050, namely, the common-mode voltage $V_{NCMI}$ may be provided to the first input 1062 of the amplifier 1050 while the common-mode voltage $V_{NCMO}$ may be provided to the second input 1064 of the amplifier 1050. Thus, the amplifier 1050 may detect the buffer offset as the difference between the common-mode voltages $V_{NCMI}$ and $V_{NCMO}$. The amplifier 1050 may then provide the detected buffer offset to the voltage-controlled voltage sources 1072 in the first and second portions 1052, 1054. In particular, as shown in FIG. 10, the amplifier 1050 may provide the detected buffer offset to the voltage-controlled voltage source 1072 in the first portion 1052 via a control path 1082, and to the voltage-controlled voltage source 1072 in the second portion 1054 via a control path 1084. In response to receiving the buffer offset from the amplifier 1050, the voltage-controlled voltage source 1072 may apply a compensation to the voltage at the output 434 of the buffer 430, coupled to the first terminal of the voltage-controlled voltage source 1072, to generate a compensated voltage at the second terminal of the voltage-controlled voltage source 1072, coupled to the first terminal of the output transistor Q2. In this manner, the voltage-controlled voltage source 1072 can perform the buffer offset adjustment at the output side of the buffer 430 (i.e., at the output 434 of the buffer 430).

To summarize, the above description makes clear that the "adjustable offset buffer with an output side offset adjustment" of FIG. 10 is realized by, or may be seen as, the buffer 430 which is made into an "adjustable offset buffer" by a combination of the resistors RCM at the nodes NCMI and NCMO and the voltage-controlled voltage source 1072 in each of the first and second portions 1052, 1054, and the amplifier 1050 configured to provide the voltage offset to be compensated for, at the output side of the buffer 430, by the voltage-controlled voltage source 1072. In other words, the current mirror arrangement 1000 may be seen as a differential circuit having the first portion 1052 and the second portion 1054, where each portion includes a current mirror circuit, a buffer amplifier circuit, and a buffer offset reduction circuit. The current mirror circuit is a circuit formed by the input transistor Q1 and Q2. The buffer amplifier circuit is formed by the buffer 430, the buffer amplifier circuit having the input 432 coupled to the first terminal of the transistor Q1 and the output 434 coupled to the first terminal of the transistor Q2. The buffer offset reduction is a circuit formed by the voltage-controlled voltage source 1072, the resistors RCM at the nodes NCMI and NCMO, and the amplifier 1050. Such a buffer offset reduction circuit is configured to adjust the voltage at the output 432 of the buffer amplifier circuit so that the voltage difference between the output 434 and the input 432 of the buffer amplifier circuit (i.e., the buffer offset) is zero, or, more generally, so that the voltage difference between the output 434 and the input 432 of the buffer amplifier circuit is below a target value. In some embodiments, the voltage at the output 432 of the buffer amplifier circuit may be adjusted based on the difference between the common-mode voltage at the input 432 of the buffer amplifier circuits of the first and second portions 852, 854 (i.e., the voltage $V_{NCMI}$) and the common-mode voltage at the outputs 434 of the buffer amplifier circuits of the first and second portions 852, 854 (i.e., the voltage $V_{NCMO}$).

While the descriptions of the adjustable offset buffer with the output side offset adjustment, provided above, refer to the NPN implementation of the transistors Q1 and Q2 (i.e., with the transistors Q1 and Q2 being implemented as NPN transistors), in other embodiments, the transistors Q1 and Q2 of the current mirror arrangement 1000 may be implemented as PNP transistors. FIG. 11 provides an electric circuit diagram of a PNP implementation of a differential current mirror arrangement 1100 with an adjustable offset buffer with an output side offset adjustment, according to some embodiments of the disclosure. The current mirror arrangement 1100 is substantially analogous to the current mirror arrangement 1000 except that each NPN transistor of the current mirror arrangement 1000 (i.e., two transistors Q1 and Q2 in each of the first portion 1042 and the second portion 1044) is replaced with a PNP transistor in the current mirror arrangement 1100. In such a configuration, the descriptions provided with reference to FIG. 10 are applicable to the current mirror arrangement 1100 except that NPN and PNP transistors are swapped, and supply and current directions are reversed. The designations such as "first/base terminals," "second/collector terminals," and "third/emitter terminals" remain the same. In the interests of brevity, a detailed description of FIG. 11 is not provided because it's substantially analogous to that of FIG. 10 except for the changes identified above.

Variations and Implementations

While the descriptions provided above refer to the bipolar implementation of the transistors, in other embodiments, any of the current mirror arrangements with adjustable offset buffers as described herein may include FETs. In particular, in further embodiments of any of the current mirror arrangements with adjustable offset buffers as described herein, each NPN transistor may be replaced with an NMOS transistor and each PNP transistor may be replaced with a PMOS transistor. In such embodiments, the descriptions provided above with reference to the drawings with bipolar transistors are applicable except that the "first terminals" or "base terminals" of the bipolar transistors become "gate terminals" for the FETs, the "second terminals" or "collector terminals" of the bipolar transistors become "drain terminals" for the FETs, and the "third terminals" or "emitter terminals" of the bipolar transistors become "source terminals" for the FETs.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure related to current mirror arrangements with adjustable offset buffers may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of current mirror arrangements with adjustable offset buffers, proposed herein, may be implemented in one or more silicon cores in Application Specific Integrated Circuits (ASICs), Field Programmable Gate Arrays (FPGAs), and other semiconductor chips.

Example Systems with Current Mirror Arrangements with Adjustable Offset Buffers

Figure 12:
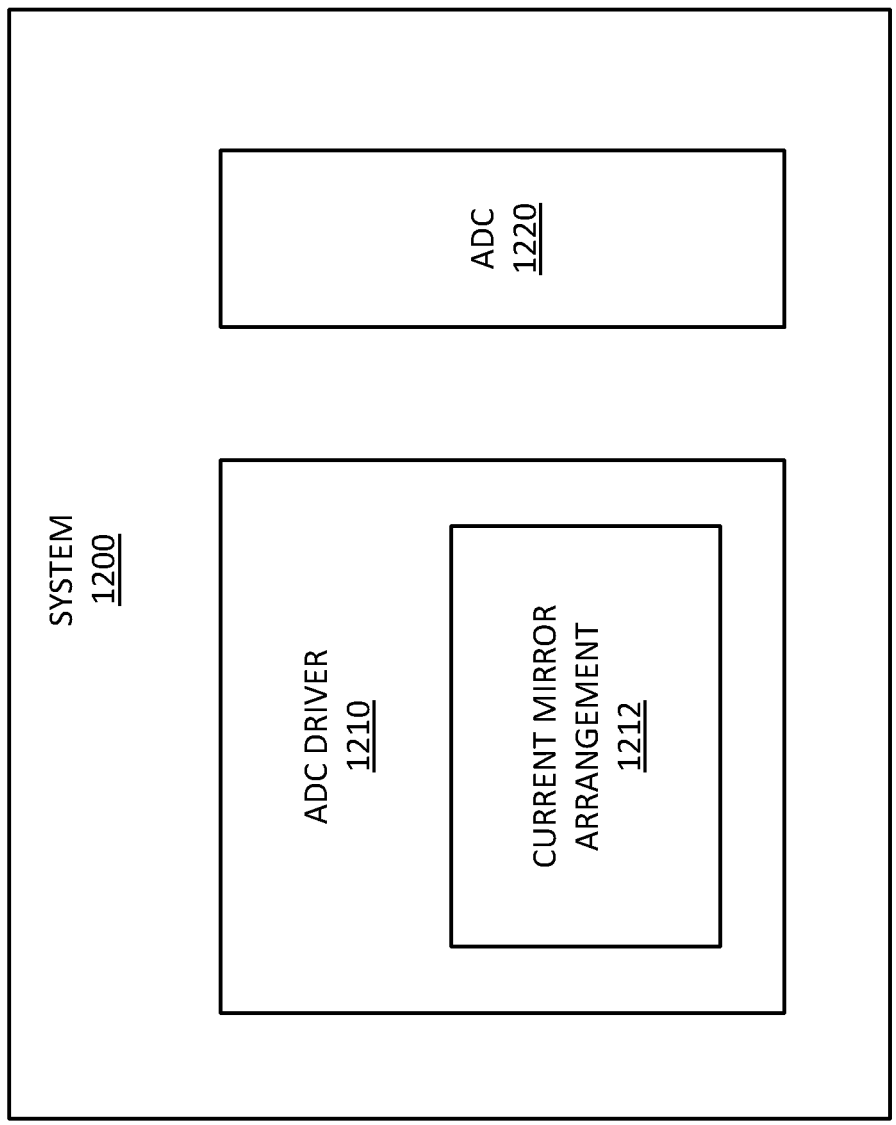
FIG. 12 provides a schematic illustration of a system implementing a current mirror arrangement with an adjustable offset buffer, according to some embodiments of the disclosure.

Various embodiments of current mirror arrangements with adjustable offset buffers as described above may be implemented in any kind of system where current mirroring may be used. Such current mirror arrangements may be particularly useful in systems where current mirrors having both high linearity and wide signal bandwidth are needed. One example of such a system is shown in FIG. 12, providing a schematic illustration of a system 1200 implementing a current mirror arrangement 1212, according to some embodiments of the disclosure. As shown in FIG. 12, the system 1200 may include an ADC driver 1210 and an ADC 1220. The ADC driver 1210 may be used to provide drive signals to drive the ADC 1220 so that the ADC 1220 can translate analog electrical signals to digital form, e.g., for data processing purposes. In particular, the ADC driver 1210 may include the current mirror arrangement 1212 which can be implemented according to any embodiments of current mirror arrangements with adjustable offset buffers, described above. For example, the current mirror arrangement 1212 may be implemented as the current mirror arrangement 500, 600, 800, 900, 1000, or 1100, or as any further embodiments of these current mirror arrangements, as described above. The ADC driver 1210 may then generate drive signals based on the output signal(s) generated by the current mirror arrangement 1212. In various embodiments, the drive signals generated by the ADC driver 1210 may be used to drive a single or dual differential input of the ADC 1220.

In various embodiments, the drive signal generated by the ADC driver 1210 may realize/implement functions such as buffering, amplitude scaling, single-ended-to-differential and differential-to-single-ended conversion, common-mode offset adjustment, and filtering. In other words, the ADC driver 1210 may act as a signal conditioning element in a data conversion stage and may be a key factor in enabling the ADC 1220 to achieve its desired performance. The ADC 1220 may be any type of ADC, such as, but not limited to, a successive approximation register (SAR) converter, a pipeline converter, a flash converter, or a sigma-delta converter.

The system 1200 shown in FIG. 12 provides just one non-limiting example where current mirror arrangements as described herein may be used and various teachings related to current mirror arrangements with adjustable offset buffers as described herein are applicable to a large variety of other systems. In some scenarios, various embodiments of current mirror arrangements with adjustable offset buffers as described herein can be used in automotive systems, safety-critical industrial applications, medical systems, scientific instrumentation, wireless and wired communications, radar, industrial process control, audio and video equipment, current sensing, instrumentation (which can be highly precise), and various digital-processing-based systems. In other scenarios, various embodiments of current mirror arrangements with adjustable offset buffers as described herein can be used in the industrial markets that include process control systems that help drive productivity, energy efficiency, and reliability. In yet further scenarios, various embodiments of current mirror arrangements with adjustable offset buffers may be used in consumer applications.

Select Examples

The following paragraphs provide examples of various ones of the embodiments disclosed herein.

Example 1 provides a current mirror arrangement that includes a current mirror circuit, a buffer amplifier circuit, and a buffer offset reduction circuit that includes current sources QBP0, QBN0, QBP1, and QBN1. The current mirror circuit includes a transistor Q1 at an input of the current mirror circuit and a transistor Q2 at an output of the current mirror circuit. The buffer amplifier circuit includes transistors QD1P, QD1N, QD2P, and QD2N arranged in a diamond buffer configuration. Each of the transistors Q1, Q2, QD1P, QD1N, QD2P, and QD2N has a first terminal, a second terminal, and a third terminal, where an input of the buffer amplifier circuit is coupled to the first terminal of the transistor Q1, an output of the buffer amplifier circuit is coupled to the first terminal of the transistor Q2, the current source QBP0 is coupled to the third terminal of the transistor QD1P, the current source QBN0 is coupled to the third terminal of the transistor QD1N, the current source QBP1 is coupled to the first terminal of the transistor QD2N, and the current source QBN1 is coupled to the first terminal of the transistor QD2P. The current sources QBP0, QBN0, QBP1, and QBN2 can be configured to provide bias currents to the transistors QD1P and QD1N (i.e., the first stage transistors of the diamond buffer of the buffer amplifier circuit), with two different current sources coupled to each of the two first stage transistors. Coupling each of the first stage transistors of the diamond buffer to two different current sources allows modifying the distribution of the total bias current between the different current sources so that the buffer offset of the buffer amplifier circuit is below a target value.

Example 2 provides the current mirror arrangement according to example 1, where the current sources QBP0, QBN0, QBP1, and QBN1 are configured to output currents such that a voltage difference between the output and the input of the buffer amplifier circuit (i.e., the buffer offset) is below a target value.

Example 3 provides the current mirror arrangement according to example 1, where the current sources QBP0, QBN0, QBP1, and QBN1 are configured to output currents such that: 1) a current IP0, output by the current source QBP0, is substantially equal to a current IN1, output by the current source QBN1, 2) a current IP1, output by the current source QBP1, is substantially equal to a current IN0, output by the current source QBN0, and 3) a sum of the current IN0 and the current IN1 is substantially equal to a sum of the current IP0 and the current IP1.

Example 4 provides the current mirror arrangement according to example 3, where a proportion of the current IP0 in the sum of the current IP0 and the current IP1 (or, equivalently, one or more of: a proportion of the current IP1 in the sum of the current IP0 and the current IP1, a proportion of the current IN0 in the sum of the current IN0 and the current IN1, and a proportion of the current IN1 in the sum of the current IN0 and the current IN1) is selected so that a voltage difference between the output and the input of the buffer amplifier circuit (i.e., the buffer offset) is below a target value.

Example 5 provides the current mirror arrangement according to examples 3 or 4, where a current at the output of the buffer amplifier circuit is substantially equal to M times of the sum of the current IP0 and the current IP1 (or, equivalently, M times of the sum of the current IN0 and the current IN1), M is a positive number greater than 0, indicative of a ratio of an area of the emitter of the transistor QD2N to an area of the emitter of the transistor QD1N when the transistors QD2N and QD1N are bipolar transistors, and indicative of a ratio of an aspect ratio of the transistor QD2N to an aspect ratio of the transistor QD1N when the transistors QD2N and QD1N are field-effect transistors. Similar relation may apply to the transistors QD2P and QD1P, i.e., M may be indicative of a ratio of an area of the emitter of the transistor QD2P to an area of the emitter of the transistor QD1P when the transistors QD2P and QD1P are bipolar transistors, and indicative of a ratio of an aspect ratio of the transistor QD2P to an aspect ratio of the transistor QD1P when the transistors QD2P and QD1P are field-effect transistors.

Example 6 provides the current mirror arrangement according to any one of examples 3-5, where the transistors QD1P, QD1N, QD2P, and QD2N are coupled to one another so that the current IP0 is combined with the current IP1 at the third terminal of the transistor QD1P, and the current IN0 is combined with the current IN1 at the third terminal of the transistor QD1N.

Example 7 provides the current mirror arrangement according to any one of the preceding examples, where the first terminal of the transistor QD2N is coupled to the third terminal of the transistor QD1P (and, therefore, the current source QBP1 is coupled to the third terminal of the transistor QD1P), and the first terminal of the transistor QD2P is coupled to the third terminal of the transistor QD1N (and, therefore, the current source QBN1 is coupled to the third terminal of the transistor QD1N).

Example 8 provides the current mirror arrangement according to example 7, where the current mirror arrangement further includes a resistor R0P and a resistor R0N, the first terminal of the transistor QD2N is coupled to the third terminal of the transistor QD1P via the resistor R0P, and the first terminal of the transistor QD2P is coupled to the third terminal of the transistor QD1N via the resistor R0N.

Example 9 provides the current mirror arrangement according to example 8, where the current mirror arrangement further includes a resistor R1P, the resistor R1P is coupled between the third terminal of the transistor QD2P and the output of the buffer amplifier circuit, and a resistance of the resistor R0P is substantially equal to 2M times of a resistance of the resistor R1P, where M is a positive number greater than 0, indicative of a ratio of an area of the emitter of the transistor QD2N to an area of the emitter of the transistor QD1N when the transistors QD2N and QD1N are bipolar transistors, and indicative of a ratio of an aspect ratio of the transistor QD2N to an aspect ratio of the transistor QD1N when the transistors QD2N and QD1N are field-effect transistors. Similar relation may apply to the transistors QD2P and QD1P, i.e., M may be indicative of a ratio of an area of the emitter of the transistor QD2P to an area of the emitter of the transistor QD1P when the transistors QD2P and QD1P are bipolar transistors, and indicative of a ratio of an aspect ratio of the transistor QD2P to an aspect ratio of the transistor QD1P when the transistors QD2P and QD1P are field-effect transistors.

Example 10 provides the current mirror arrangement according to example 9, where the current mirror arrangement further includes a resistor R1N, the resistor R1N is coupled between the third terminal of the transistor QD2N and the output of the buffer amplifier circuit, and a resistance of the resistor R0N is substantially equal to 2M times of resistance of the resistor R1N, and is substantially equal to the resistance of the resistor R0P.

Example 11 provides a current mirror arrangement that includes a current mirror circuit, a diamond buffer, and a buffer offset reduction circuit. The current mirror circuit includes an input transistor Q1 and an output transistor Q2. The diamond buffer includes a plurality of transistors. The diamond buffer has an input coupled to a first terminal of the input transistor Q1, and further has an output coupled to a first terminal of the output transistor Q2. The buffer offset reduction circuit is configured to adjust bias currents provided by a plurality of bias current sources to individual transistors of the plurality of transistors of the diamond buffer so that a voltage difference between the output and the input of the buffer amplifier circuit (i.e., the buffer offset) is below a target value.

Example 12 provides the current mirror arrangement according to example 11, where the diamond buffer includes a first stage and a second stage, the second stage is coupled to the first stage, the first stage includes a first and a second transistors (QD1P and QD1N, respectively) of the plurality of transistors, and the second stage includes a third and a fourth transistors (QD2N and QD2P, respectively) of the plurality of transistors.

Example 13 provides the current mirror arrangement according to example 12, where the first and the second transistors form an emitter follower, and the third and the fourth transistors form a class-ab buffer.

Example 14 provides the current mirror arrangement according to examples 12 or 13, where each of the plurality of transistors has a first terminal, a second terminal, and a third terminal, the first terminal of the first transistor is coupled to the first terminal of the second transistor, the third terminal of the third transistor is coupled to the third terminal of the fourth transistor, the third terminal of the first transistor is coupled to the first terminal of the third transistor, and the third terminal of the second transistor is coupled to the first terminal of the fourth transistor.

Example 15 provides the current mirror arrangement according to example 14, where each of the first terminal of the first transistor and the first terminal of the second transistor is coupled to the input of the diamond buffer (and, therefore, is coupled to the first terminal of the input transistor Q1 of the current mirror circuit), and each of the third terminal of the third transistor and the third terminal of the fourth transistor is coupled to the output of the diamond buffer (and, therefore, is coupled to the first terminal of the output transistor Q2 of the current mirror circuit).

Example 16 provides the current mirror arrangement according to examples 14 or 15, where the buffer offset reduction circuit includes a first, a second, a third, and a fourth current sources (QBP0, QBN0, QBP1, and QBN1, respectively), each of the first and the third current sources is coupled to the third terminal of the first transistor, and each of the second and the fourth current sources is coupled to the third terminal of the second transistor.

Example 17 provides a current mirror arrangement that includes a first portion, a second portion, and a buffer offset reduction circuit. Each of the first and second portions includes a current mirror, configured to receive a respective (i.e., different) input current at an input (e.g., the first portion may receive an input signal in the form of a first input current $I_{INP}$ that is based on a sum of a bias current IB for the current mirror arrangement and an input signal current $I_{IN}$ (e.g., $I_{INP}=IB+I_{IN}$), while the second portion may receive the input signal in the form of a second input current $I_{INM}$ that is based on a difference between the bias current IB and the input signal current $I_{IN}$ (e.g., $I_{INM}=IB-I_{IN}$); thus, the first and second portions may be portions of a differential current mirror arrangement) and provide a respective (i.e., different) output current at an output, where a ratio of the output current to the input current is equal to K (thus, the output current of the first portion may be $6=K*I_{INP}$ and the output current of the second portion may be $I_{OM}=K*I_{INM}$), where K is a number greater than 0 (which value may, but does not have to be, an integer), the current mirror including a transistor Q1 and a transistor Q2, where a second terminal of the transistor Q1 is coupled to the input of the current mirror (i.e., coupled to the input current for the portion), the second terminal of the transistor Q1 is also coupled to the first terminal of the transistor Q1) and a second terminal of the transistor Q2 is coupled to the output of the current mirror for the portion (i.e., coupled to the output current for the portion). Each portion further includes a buffer amplifier circuit, having an input coupled to a first terminal of the transistor Q1 and an output coupled to a first terminal of the transistor Q2. The buffer offset reduction circuit is configured to adjust bias currents provided to individual transistors of the buffer amplifier circuit so that a voltage difference between the output and the input of the buffer amplifier circuit (i.e., the buffer offset) is below a target value. The bias currents are adjusted based on a difference between a combination of a voltage at the first terminal of the transistor Q1 of the first portion and a voltage at the first terminal of the transistor Q1 of the second portion and a combination of a voltage at the first terminal of the transistor Q2 of the first portion and a voltage at the first terminal of the transistor Q2 of the second portion.

Example 18 provides a differential current mirror arrangement that includes a first portion and a second portion. Each portion includes a current mirror circuit including an input transistor Q1 and an output transistor Q2, a buffer amplifier circuit, having an input coupled to a first terminal of the transistor Q1 and an output coupled to a first terminal of the transistor Q2, and a buffer offset reduction circuit, configured to adjust a voltage at the input of the buffer amplifier circuit so that a voltage difference between the output and the input of the buffer amplifier circuit (i.e., the buffer offset) is below a target value.

Example 19 provides the current mirror arrangement according to example 18, where the voltage at the input of the buffer amplifier circuit is adjusted based on the voltage difference between a common-mode voltage at the inputs of the buffer amplifier circuits of the first and second portions and a common-mode voltage at the outputs of the buffer amplifier circuits of the first and second portions.

Example 20 provides a differential current mirror arrangement that includes a first portion and a second portion. Each portion includes a current mirror circuit including an input transistor Q1 and an output transistor Q2, a buffer amplifier circuit, having an input coupled to a first terminal of the transistor Q1 and an output coupled to a first terminal of the transistor Q2, and a buffer offset reduction circuit, configured to adjust a voltage at the output of the buffer amplifier circuit so that a voltage difference between the output and the input of the buffer amplifier circuit (i.e., the buffer offset) is below a target value.

Example 21 provides the current mirror arrangement according to example 20, where the voltage at the output of the buffer amplifier circuit is adjusted based on the voltage difference between a common-mode voltage at the inputs of the buffer amplifier circuits of the first and second portions and a common-mode voltage at the outputs of the buffer amplifier circuits of the first and second portions.

Example 22 provides an electronic device that includes an ADC, configured to perform analog-to-digital conversion; and further includes an ADC driver configured to provide a drive signal to the ADC to enable the ADC to perform the analog-to-digital conversion, the ADC driver including the current mirror arrangement according to any one of the preceding examples.

Example 23 provides the electronic device according to example 22, where the electronic device is, or is included in, automatic test equipment, test equipment, military radar/LIDAR, civil radar/LIDAR, automotive radar/LIDAR, industrial radar/LIDAR, cellular base stations, high speed wireline or wireless communication transceivers, or high speed digital control systems.

Example 24 provides an ADC system that includes an ADC configured to perform analog-to-digital conversion; and an ADC driver configured to provide a drive signal to the ADC to enable the ADC to perform the analog-to-digital conversion, the ADC driver including the current mirror arrangement according to any one of the preceding examples.

In other embodiments, the current mirror arrangement according to any one of the preceding examples may be incorporated in other kinds of components of an electronics device, besides being included in an ADC driver. Examples of other components where the current mirror arrangement according to any one of the preceding examples may be incorporated include amplifiers, mixers, and filters, e.g., high-speed amplifiers, high-speed mixers, and high-speed filters. In turn, such components may be included in devices such as automatic test equipment, test equipment, military radar/LIDAR, civil radar/LIDAR, automotive radar/LIDAR, industrial radar/LIDAR, cellular base stations, high speed wireline or wireless communication transceivers, or high speed digital control systems.

The invention claimed is:

1. An electronic device, comprising a current mirror arrangement, the current arrangement comprising:
a current mirror circuit, comprising a transistor Q1 at an input of the current mirror circuit and a transistor Q2 at an output of the current mirror circuit;
a resistor R0P;
a buffer amplifier circuit, comprising transistors QD1P, QD1N, QD2P, and QD2N; and
current sources QBP0, QBN0, QBP1, and QBN1,
wherein:
each of the transistors Q1, Q2, QD1P, QD1N, QD2P, and QD2N has a first terminal, a second terminal, and a third terminal,
an input of the buffer amplifier circuit is coupled to the first terminal of the transistor Q1,
an output of the buffer amplifier circuit is coupled to the first terminal of the transistor Q2,
the current source QBP0 is coupled to the third terminal of the transistor QD1P,
a first terminal of the resistor R0P is coupled to the current source QBP0 and the third terminal of the transistor QD1P,
a second terminal of the resistor R0P is coupled to the current source QBP1 and the first terminal of the transistor QD2N,
the current source QBN0 is coupled to the third terminal of the transistor QD1N,
the current source QBP1 is coupled to the first terminal of the transistor QD2N, and
the current source QBN1 is coupled to the first terminal of the transistor QD2P.

2. The electronic device according to claim 1, wherein the current sources QBP0, QBN0, QBP1, and QBN1 are to output currents such that:
a current IP0, output by the current source QBP0, is substantially equal to a current IN1, output by the current source QBN1, and
a current IP1, output by the current source QBP1, is substantially equal to a current IN0, output by the current source QBN0.

3. The electronic device according to claim 2, wherein:
the transistors QD2N and QD1N are bipolar transistors,
a current at the output of the buffer amplifier circuit is substantially equal to M times of a sum of the current IP0 and the current IP1, and
M is a positive number greater than 0, indicative of a ratio of an area of the emitter of the transistor QD2N to an area of the emitter of the transistor QD1N.

4. The electronic device according to claim 2, wherein the transistors QD1P, QD1N, QD2P, and QD2N are coupled to one another so that:
the current IP0 is combined with the current IP1 at the third terminal of the transistor QD1P.

5. The electronic device according to claim 1, wherein:
the current mirror arrangement further includes a resistor R1P,
the resistor R1P is coupled between the third terminal of the transistor QD2P and the output of the buffer amplifier circuit, and
a resistance of the resistor R0P is substantially equal to 2M times of a resistance of the resistor R1P,
where M is a positive number greater than 0, indicative of a ratio of an area of the emitter of the transistor QD2N to an area of the emitter of the transistor QD1N when the transistors QD1N and QD2N are bipolar transistors and indicative of a ratio of an aspect ratio of the transistor QD2N to an aspect ratio of the transistor QD1N when the transistors QD1N and QD2N are field-effect transistors.

6. The electronic device according to claim 5, wherein:
the current mirror arrangement further includes a resistor R1N, and
the resistor R1N is coupled between the third terminal of the transistor QD2N and the output of the buffer amplifier circuit.

7. The electronic device according to claim 6, wherein:
a resistance of the resistor R0P is substantially equal to 2M times of a resistance of the resistor R1N.

8. The electronic device according to claim 6, wherein:
the current mirror arrangement further includes a resistor R0N, and
the first terminal of the transistor QD2P is coupled to the third terminal of the transistor QD1N via the resistor R0N, and
a resistance of the resistor R0N is substantially equal to the resistance of the resistor R0P.

9. The electronic device according to claim 8, wherein:
the resistance of the resistor R0N is substantially equal to 2M times of a resistance of the resistor R1N.

10. The electronic device according to claim 1, wherein the current sources QBP0, QBN0, QBP1, and QBN1 are to output currents such that:
a sum of a current IN0, output by the current source QBN0, and a current IN1, output by the current source QBN1, is substantially equal to a sum of a current IP0, output by the current source QBP0, and a current IP1, output by the current source QBP1.

11. An electronic device, comprising a current mirror arrangement, the current mirror arrangement comprising:
a current mirror circuit, comprising a transistor Q1 at an input of the current mirror circuit and a transistor Q2 at an output of the current mirror circuit; and a buffer amplifier circuit, comprising transistors QD1P, QD1N, QD2P, QD2N, QBP0, QBN0, QBP1, and QBN1, wherein:
each of the transistors Q1, Q2, QD1P, QD1N, QD2P, QD2N, QBP0, QBN0, QBP1, and QBN1 has a first terminal, a second terminal, and a third terminal,
an input of the buffer amplifier circuit is coupled to the first terminal of the transistor Q1,
an output of the buffer amplifier circuit is coupled to the first terminal of the transistor Q2,
the second terminal of the transistor QBP0 is coupled to the third terminal of the transistor QD1P,
the second terminal of the transistor QBN0 is coupled to the third terminal of the transistor QD1N,
the second terminal of the transistor QBP1 is directly connected to the first terminal of the transistor QD2N,
the second terminal of the transistor QBN1 is directly connected to the first terminal of the transistor QD2P,
for each transistor of the transistors QBP1 and QBN1, the second terminal is a drain terminal if the transistor is a field-effect transistor, and the second terminal is a collector terminal if the transistor is a bipolar junction transistor, and
for each transistor of the transistors QD2N and QD2P, the first terminal is a gate terminal if the transistor is a field-effect transistor, and the first terminal is a base terminal if the transistor is a bipolar junction transistor.

12. The electronic device according to claim 11, wherein the transistors QBP0, QBN0, QBP1, and QBN1 are to output currents such that:
a current IP0, output by the transistor QBP0, is substantially equal to a current IN1, output by the transistor QBN1, and
a current IP1, output by the transistor QBP1, is substantially equal to a current IN0, output by the transistor QBN0, and
a sum of the current IN0 and the current IN1 is substantially equal to a sum of the current IP0 and the current IP1.

13. The electronic device according to claim 1, further comprising:
a resistor R1P,
wherein:
a first terminal of the resistor R1P is coupled to the third terminal of the transistor QD2P,
a second terminal of the resistor R1P is coupled to the output of the buffer amplifier circuit, and
a resistance of the resistor R0P is substantially equal to 2M times of a resistance of the resistor R1P, where M is a positive number greater than 0, indicative of a ratio of an area of an emitter of the transistor QD2N to an area of an emitter of the transistor QD1N when the transistors QD1N and QD2N are bipolar transistors and indicative of a ratio of an aspect ratio of the transistor QD2N to an aspect ratio of the transistor QD1N when the transistors QD1N and QD2N are field-effect transistors.

14. The electronic device according to claim 13, further comprising:
a resistor R0N; and
a resistor R1N;
wherein:
the first terminal of the resistor R0N is coupled to each of the current source QBN0 and the third terminal of the transistor QD1N,
the second terminal of the resistor R0P is coupled to each of the current source QBN1 and the first terminal of the transistor QD2P,
the first terminal of the resistor R1N is coupled to the third terminal of the transistor QD2N,
the second terminal of the resistor R1N is coupled to the output of the buffer amplifier circuit, and
a resistance of the resistor R0N is substantially equal to 2K times of a resistance of the resistor R1N, where K is a positive number greater than 0, indicative of a ratio of an area of an emitter of the transistor QD2P to an area of an emitter of the transistor QD1P when the transistors QD1P and QD2P are bipolar transistors and indicative of a ratio of an aspect ratio of the transistor QD2P to an aspect ratio of the transistor QD1P when the transistors QD1P and QD2P are field-effect transistors.

15. The electronic device according to claim 1, wherein the electronic device is a driver for an analog-to-digital converter.

16. The electronic device according to claim 1, wherein:
the second terminal of the transistor QD1P is coupled to a first reference potential, and
the second terminal of the transistor QD1N is coupled to a second reference potential.

17. The electronic device according to claim 11, wherein the electronic device is a driver for an analog-to-digital converter.

18. The electronic device according to claim 11, wherein the electronic device is a system that includes an analog-to-digital converter (ADC) and a driver for the ADC, and wherein the current mirror arrangement is included in the driver for the ADC.

19. The electronic device according to claim 11, wherein, for an individual transistor of the transistors Q1, Q2, QD1P, QD1N, QD2P, QD2N, QBP0, QBN0, QBP1, and QBN1:
the first terminal is a gate terminal, the second terminal is a drain terminal, and the third terminal is a source terminal if the individual transistor is a field-effect transistor, and
the first terminal is a base terminal, the second terminal is a collector terminal, and the third terminal is an emitter terminal if the individual transistor is a bipolar transistor.

20. The electronic device according to claim 11, wherein:
the second terminal of the transistor QD1P is coupled to a first reference potential, and
the second terminal of the transistor QD1N is coupled to a second reference potential.

* * * * *